United States Patent [19]

Fudeyasu

[11] Patent Number: 5,327,386
[45] Date of Patent: Jul. 5, 1994

[54] DUAL PORT SEMICONDUCTOR MEMORY DEVICE WITH HIGH SPEED DATA TRANSFER DURING READING AND WRITING MODES

[75] Inventor: Yoshio Fudeyasu, Hyogo, Japan

[73] Assignee: Mitsubishi Denki Kabushiki Kaisha, Tokyo, Japan

[21] Appl. No.: 794,094

[22] Filed: Nov. 18, 1991

[30] Foreign Application Priority Data

Nov. 20, 1990 [JP] Japan .................. 2-316849

[51] Int. Cl.$^5$ ............................ G11C 7/00; G11C 8/00
[52] U.S. Cl. ............................ 365/221; 365/189.05; 365/220; 365/230.05
[58] Field of Search ............ 365/189.05, 154, 221, 365/220, 230.05

[56] References Cited

U.S. PATENT DOCUMENTS

| | | | |
|---|---|---|---|
| 4,680,491 | 7/1987 | Yokouchi et al. | 365/189.05 |
| 4,740,922 | 4/1988 | Ogawa | 365/189.04 |
| 4,758,987 | 7/1988 | Sakui | 365/203 |
| 4,831,590 | 5/1989 | Ichinose | 365/189.05 |
| 4,873,665 | 10/1989 | Jiang et al. | 365/154 |
| 4,964,081 | 10/1990 | Birrittella et al. | 365/154 |
| 4,995,003 | 2/1991 | Watanabe et al. | 365/189.05 |
| 5,040,146 | 8/1991 | Mattausch et al. | 365/154 |
| 5,065,363 | 11/1991 | Sato et al. | 365/189.05 |
| 5,088,062 | 1/1992 | Shikata | 365/189.05 |
| 5,146,428 | 9/1992 | Tanimura | 365/189.05 |

Primary Examiner—Eugene R. LaRoche
Assistant Examiner—Son Dinh
Attorney, Agent, or Firm—Lowe, Price, LeBlanc & Becker

[57] ABSTRACT

A dual port memory is disclosed capable of serial data reading and writing between a memory array including a memory cell formed by one MOS transistor and one capacitor and a single data input/output line. A flipflop and a sense amplifier are provided corresponding to each memory cell column of the memory array. Each flipflop includes a first inverter having a large drive capability and a second inverter having a small drive capability, connected to the input end and the output end of each other. The input end of the first inverter is connected to the corresponding sense amplifier via a single MOS transistor. The output ends of the firs and second inverters are connected to the data input/output line via first and second MOS transistors, respectively. At the time of data reading from the memory array to the data input/output line, the single MOS transistor and the first MOS transistor conduct. At the time of data writing from the data input/output line to the memory array, the single MOS transistor and the second MOS transistor conduct. Accordingly, the first inverter implements a transfer path of the stored data of the memory array from the sense amplifier to the data input/output line. The second inverter implements a transfer path of an external data from the data input/output line to the sense amplifier.

22 Claims, 15 Drawing Sheets

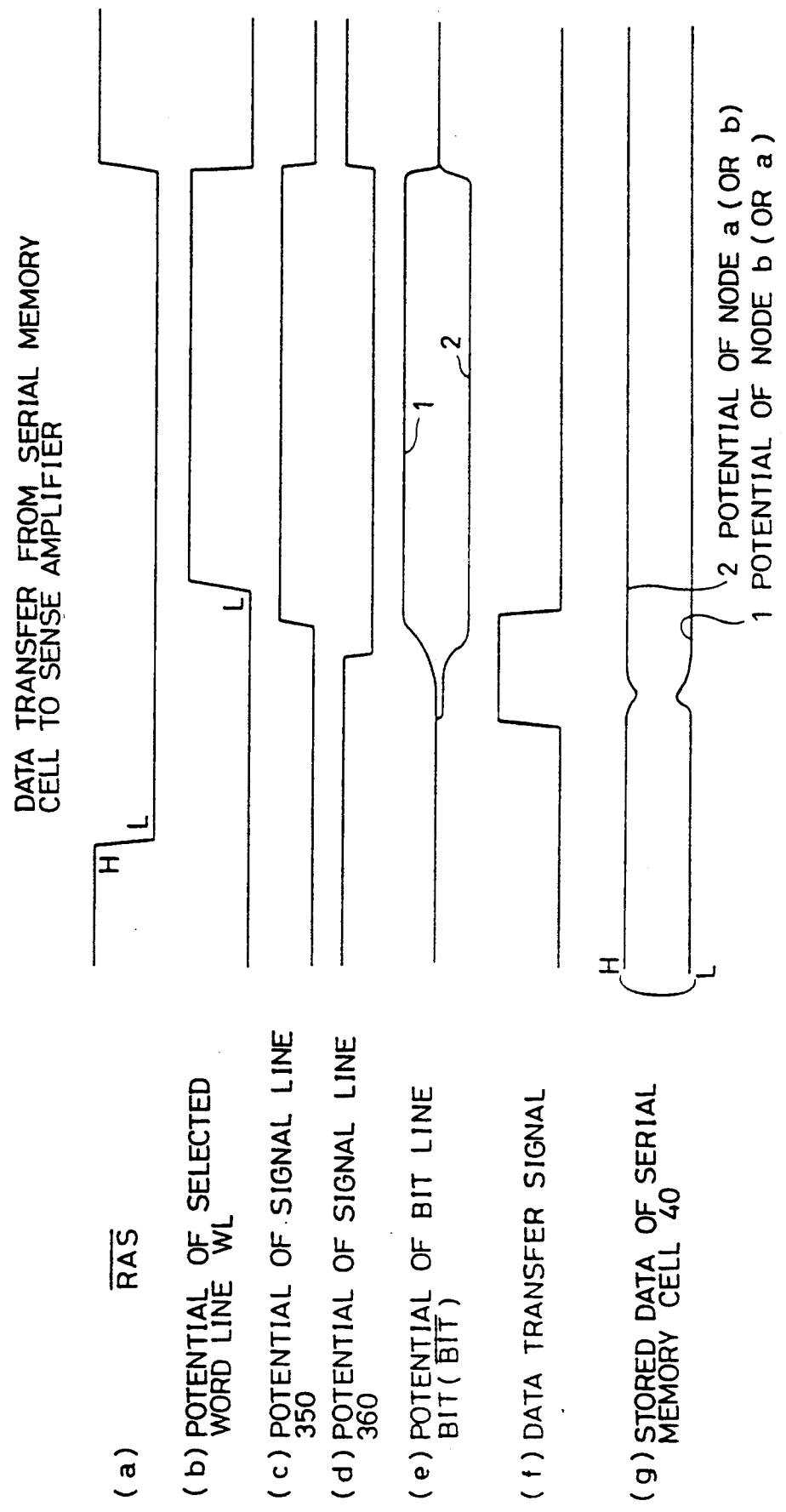

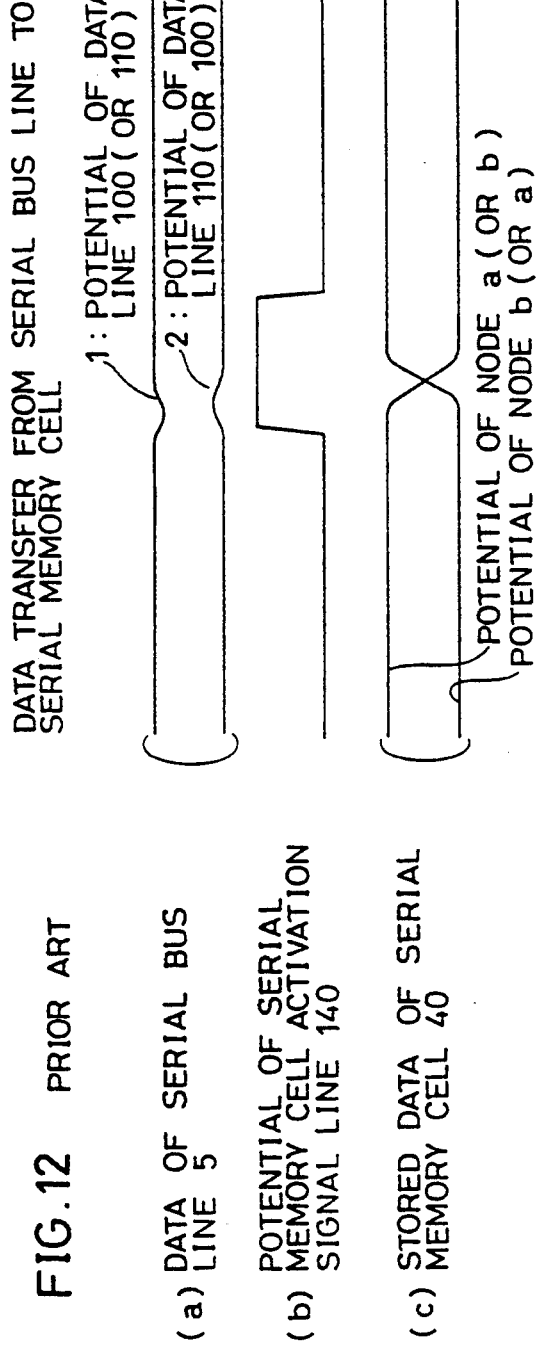
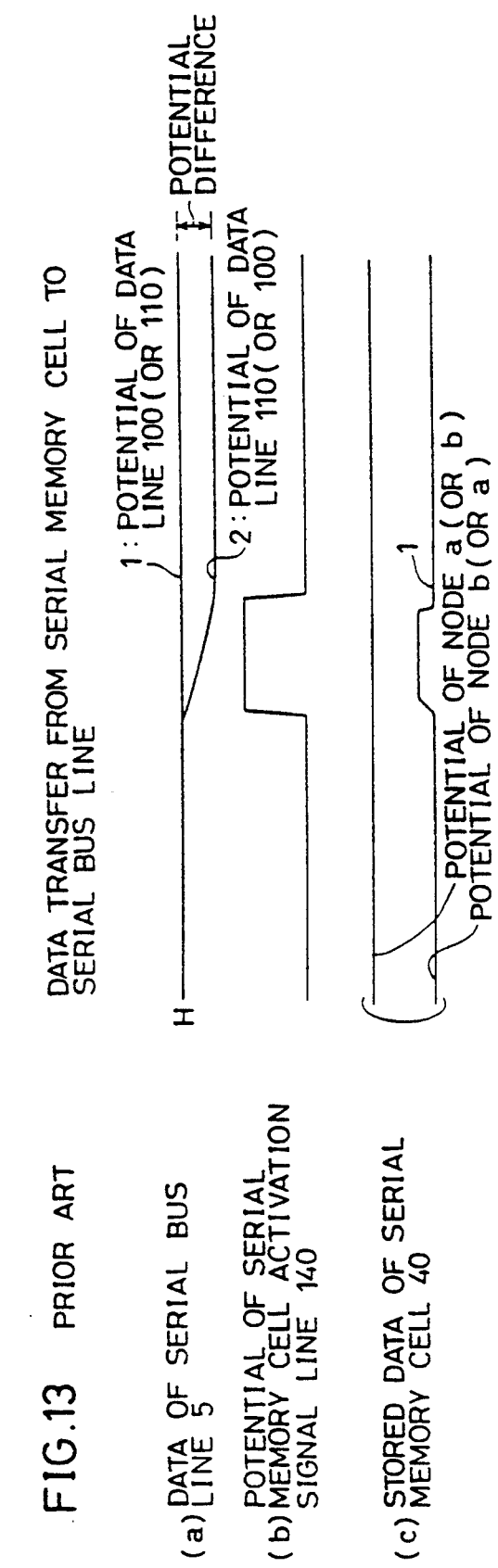

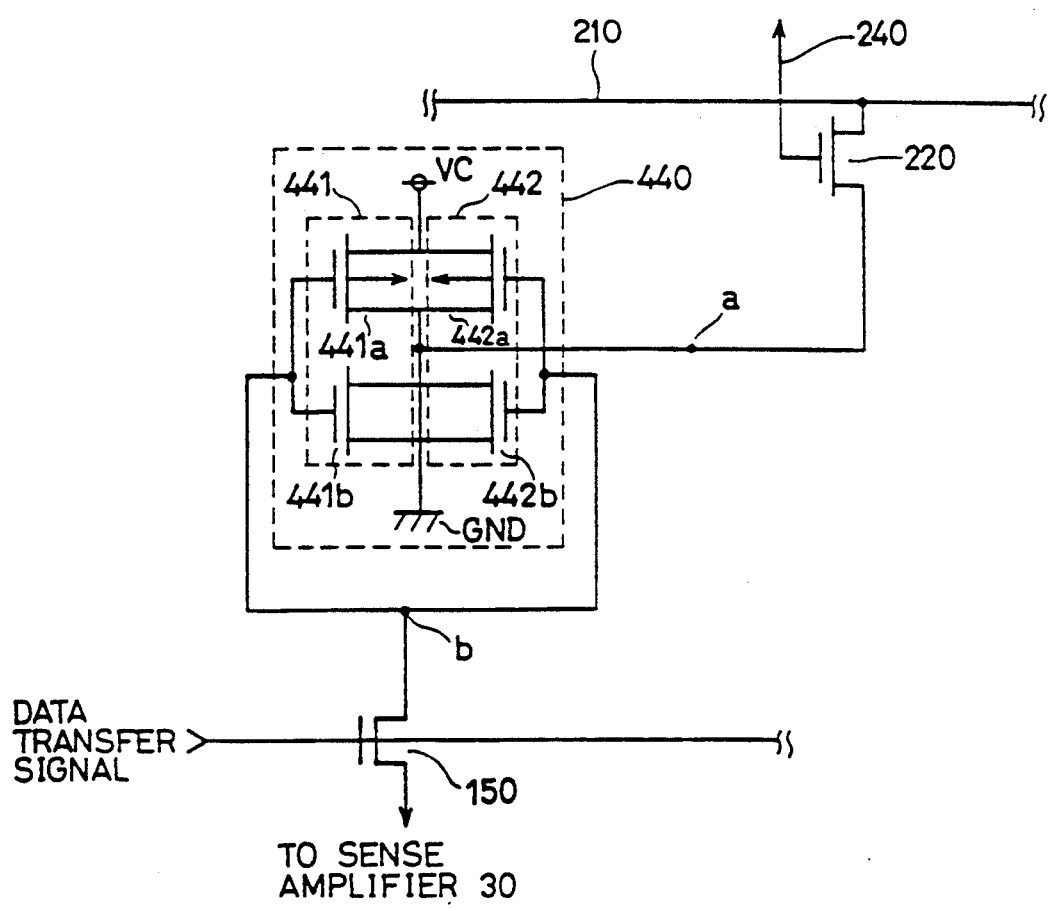

DUAL PORT SEMICONDUCTOR MEMORY DEVICE WITH HIGH SPEED DATA TRANSFER DURING READING AND WRITING MODES

BACKGROUND OF THE INVENTION

1. Field of the Invention

The present invention relates to semiconductor memory devices, and more particularly, to a semiconductor memory device such as a dual port memory comprising two types of memory arrays carrying out data transmission/reception between each other.

2. Description of the Background Art

In accordance with the multifunction and high performance of video equipments, high performance is also required by semiconductor memory devices for storing video signals as digital data, i.e. required by semiconductor memory devices for video such as video RAMs (Random Access Memory). A dual port memory is a semiconductor memory device that has the function to read and write in parallel and in series a plurality of data, employed as the semiconductor memory device for video.

FIG. 6 is a block diagram schematically showing the entire structure of a conventional dual port memory. The structure and operation of the conventional dual port memory will be explained hereinafter with reference to FIG. 6. In the following description, H level and L level correspond to power potential and ground potential, respectively.

Referring to FIG. 6, a conventional dual port memory 1 comprises a memory array 2 having a plurality of memory cells MC each formed of one MOS transistor TR and one capacitor C arranged in a matrix of rows and columns; a sense amplifier portion 3, a serial register 4, a serial bus line 5, a serial decoder 6, a counter 7, a serial data output terminal SDO, and a serial data input terminal SDI all provided for writing to and reading from memory array 2 a plurality of data in series; a row address buffer 11, a column address buffer 12, a row decoder 13, a column decoder 14, a data bus line 15, a parallel data output terminal PDO, and a parallel data input terminal PDI all provided for writing to and reading from memory array 2 a plurality of data in parallel.

Row address buffer 11 buffers address data AX0-AX7 of 8 bits, for example, forming an external row address signal AX to provide the same to row decoder 13. Similarly, column address buffer 12 buffers address data AY0-AY7 of 8 bits, for example, forming an external column address signal AY to provide the same to row decoder 14. Row decoder 3 is connected to all word lines WL included in memory array 2. Column decoder 14 is connected to all bit lines BL included in memory array 2 via data bus line 15. In memory array 2, the gates of respective transistors TR of the memory cells MC arranged along one row are connected to the same word line WL. The drains of respective transistors TR of the memory cells MC arranged along one column are connected to the same bit line BL.

Row decoder 13 applies a potential of H level only to the word line WL corresponding to the row specified by row address signals AX0-AX7 from row address buffer 11 (referred to as the selected word line hereinafter), out of all the word lines WL in memory array 2. This causes transistor TR in each memory cell MC arranged in the row selected by external row address signal AX to conduct, whereby capacitor C is electrically connected to bit line BL corresponding to the relative memory cell MC. Column decoder 14 electrically connects a plurality of bit lines BL corresponding to the column selected by column address signals AY0-AY7 from column address buffer 12 (referred to as the selected bit line hereinafter), out of the bit lines BL in memory array 2, to parallel data output terminal PDO and parallel data input terminal PDI via data bus line 15. Parallel data input terminal PDI is applied with parallel data of a predetermined bit length as the write data from an external source at the time of data writing. Parallel data output terminal PDO provides the output of data bus line 15 in parallel to an external source as the read out data at the time of data reading.

By the above described operations of row decoder 13 and column decoder 14, each capacitor C of memory cell MC connected to the selected word line WL and the selected bit line BL is charged or discharged according to the write data provided in parallel to parallel data input terminal PDI, at the time of data writing. As a result, the potential of the node of transistor TR and capacitor C in each memory cell MC connected to the selected word line WL and the selected bit line BL attains a potential of H level or L level according to the write data. That is to say, data is written simultaneously to all the memory cells MC of one row connected to the selected word like WL.

At the time of data reading, the potential of parallel data output terminal PDO is determined according to the potential of the node of transistor TR and capacitor C of each memory cell MC connected to the selected word line WL and selected bit line BL. That is to say, the stored data in the memory cells MC connected to the selected bit line BL and the selected word line WL appears at parallel data output terminal PDO via the corresponding bit line BL and data bus line 15. Thus, at the time of data reading, the stored data of the memory cells MC of one row connected to the selected word line WL are provided simultaneously from parallel data output terminal PDO.

The foregoing is the operation for writing and reading parallel data in the dual port memory. The operation of reading and writing serial data in a dual port memory will be explained hereinafter.

Row address buffer 11 and row decoder 13 operate in a manner similar to the case of parallel data writing and reading. Accordingly, the potential of only one word line WL selected from word lines WL in memory array 2 attains an H level. Column address buffer 12 responds to external column address signals AY0-AY7 for providing serial address signals SA0-SA7 of 8 bits, for example, for specifying each of the plurality of columns specified by column address signals AY0-AY7. Then, counter 7 responds to serial address signals SA0-SA7 for providing to serial decoder 6 serial column address signals SY0-SY7 of 8 bits, for example, for specifying sequentially one by one the columns of the address specified by external column address signal AY.

At the time of data reading, sense amplifier portion 3 amplifies the potential change generated at each bit line BL in memory array 2 and provides the same simultaneously to serial register 4. Serial register 4 temporarily stores the amplified output of sense amplifier portion 3 at the time of data reading. Serial decoder 6 controls electrical connection between serial bus line 5 and serial register 4 so that serial bus line 5 is provided with only the amplified output of the potential change generated at the bit lines BL corresponding to the columns selected by serial column address signals SY0–SY7 from counter 7, out of the temporarily stored amplified output in serial register 4. Serial column address signals SY0–SY7 provided from counter 7 specifies in time sequence the columns in memory array 2 one by one. This causes the amplified output of sense amplifier portion 3, temporarily stored in serial register 4, to be transferred one at a time to serial data output terminal SDO via serial bus line 5, at the time of data reading. At the time of data reading, a potential change corresponding to the potential of the node between transistor TR and capacitor C in each memory cell MC connected to the selected word line WL and the selected bit line BL is generated at the corresponding bit line BL. Accordingly, the stored data in memory cells MC along one row connected to the selected word line WL are provided one by one from serial data output terminal SDO sequentially to an external source.

At the time of data reading, a plurality of data to be written into all the memory cells MC connected to one word line WL in memory array 2 are applied serially from an external source as an H or L voltage signal to serial data input terminal SDI. These plurality of data are provided to serial bus line 5 one by one in time sequence. Serial decoder 6 controls the electrical connection between serial bus line 5 and respective bit lines BL in memory array 2, so that each data provided to serial bus line 5 is applied only to one bit line BL specified by serial column address signals SY0–SY7 from counter 7 via serial register 4 and sense amplifier portion 3, at the time of data writing. Serial column address signals SY0–SY7 provided from counter 7 specify the columns in memory array 2 one by one in time sequence. At the time of data writing, a plurality of data applied to serial data input terminal SDI from an external source are provided to bit line BL to which memory cells MC that will store the data are connected. As a result, external data are written into memory cells MC of one row connected to selected word line.

In addition to the above described functional components, the dual port memory comprises a clock generating circuit 16. Clock generating circuit 16 generates various clock signals controlling the operation timing of the above described components so that the above described circuit operations for reading and writing parallel data and serial data are implemented correctly, according to external control signals $\overline{RAS}$, $\overline{CAS}$, SC, $\overline{DT}$. For example, the circuit operation for reading and writing serial data is controlled by an internal serial clock signal SC generated from clock generating circuit 16 in response to an external serial clock signal SC.

FIG. 7 indicates the circuit configuration of memory array 2, sense amplifier portion 3, serial register 4, and serial bus line 5.

Referring to FIG. 7, sense amplifier portion 3 comprises differential amplification type sense amplifiers 30. The number of sense amplifiers 30 is a half of the numbers of bit lines BL in memory array 2. Each sense amplifier 30 has two bit lines BL of memory array 2 connected. In memory array 2, the two bit lines BL connected to each sense amplifier 30 form one bit line pair attaining complementary potentials at the time of data reading and writing. The memory cells MC connected to one bit line BIT out of the two bit lines forming one bit line pair and the memory cells MC connected to the other bit line $\overline{BIT}$ are connected to different word lines WL. At the time of serial data reading, sense amplifier 30 amplifies the potential difference between one bit line BIT and the other bit line $\overline{BIT}$.

FIG. 8 is a circuit showing a structure of sense amplifier 30. Referring to FIG. 8, sense amplifier 30 comprises a P channel MOS transistor 310 and an N channel MOS transistor 320 having the gates thereof connected to bit line BIT; and a P channel MOS transistor 330 and an N channel MOS transistor 340 having the gates thereof connected to bit line $\overline{BIT}$. Transistor 310 and 320 are connected in series between signal lines 350 and 360. Similarly, transistors 330 and 340 are connected in series between signal lines 350 and 360. At the time of serial data reading and writing, power potential and ground potential are applied to signal lines 350 and 360, respectively. Therefore, at the time of serial data reading, if memory cell MC connected to the selected word line WL is connected to bit line BIT, and the potential of the node of transistor TR and capacitor C in this memory cell MC attains an H level, a slight charge is applied from capacitor C to bit line BIT, whereby the potential of bit line BIT rises according to this slight charge. In initiating data reading, bit line BIT and bit line $\overline{BIT}$ are equalized so that the potentials of bit line BIT and bit line $\overline{BIT}$ are identical. The potential rise in bit line BIT causes the generation of slight potential difference between bit line BIT and bit line $\overline{BIT}$. Sense amplifier 30 operates to increase this potential difference between bit lines BIT and $\overline{BIT}$.

More specifically, the potential rise of bit line BIT causes transistor 320 to become slightly conductive. As a result, there are potential drops in the gate node of transistors 330 and 340 and node d. In response to this potential drop, transistor 330 also becomes slightly conductive to generate potential rise in the gate node of transistors 310 and 320 and node c. Transistor 320 becomes heavily conductive by this potential rise to pull down the potentials of the gate node of transistors 330 and 340 and node d to the ground potential applied to signal line 360. Because transistor 330 also becomes heavily conductive in response, the potential of nodes c rises to the power potential applied to signal line 350. The potential of node d of transistors 310 and 320 and the potential of node c of transistors 330 and 340 are the output of sense amplifier 30. Thus, the potential of bit line BIT is pulled down to the power potential by sense amplifier 30 and applied to serial register 4. The potential of bit line $\overline{BIT}$ is pulled down to the ground potential by sense amplifier 30 and applied to serial register 4.

On the contrary, if memory cell MC connected to the selected word line WL is connected to bit line BIT, and the potential of the node of transistor TR and capacitor C of this memory cell MC attains an L level, slight charge is provided to this capacitor C from bit line BIT. Accordingly, the potential of bit line BIT drops according this slight charge. This causes transistor 310 to become slightly conductive in sense amplifier 30 to raise the potential of the gate node of transistors 330 and 340. In response, transistor 340 also becomes slightly conductive to drop the potential of the gate node of transistor 310 and 320. As a result, transistors 310 and 340 become heavily conductive, whereby the potential of node c is pulled down to the ground potential and the potential of node d is pulled up to the power potential.

Hence, the slight potential difference between bit lines BIT and $\overline{BIT}$ is amplified to the differential voltage between the power potential and the ground potential by sense amplifier 30. When memory cells MC connected to the selected word line WL are connected to bit lines $\overline{\text{BIT}}$, the potential difference between bit lines BIT and $\overline{\text{BIT}}$ is amplified by either transistor 330 or 340 rendered conductive in each sense amplifier 30 since there is slight potential rise or drop in bit line $\overline{\text{BIT}}$.

Referring to FIG. 7 again, serial register 4 comprises a plurality of flipflops 40 each provided corresponding to each sense amplifier 30. Flipflop 40 is connected to the corresponding sense amplifier 30 via two N channel MOS transistors 150 and 160. Flipflop 40 comprises two inverters 410 and 420 having each input and output terminal thereof connected to each other. As shown in FIG. 8, sense amplifier 30 comprises an output end (node c) of the bit line BIT side and an output end (node d) of the bit line $\overline{\text{BIT}}$ side. The output end of the bit line BIT side is connected to the input end of inverter 420 via transistor 150, and the output end of bit line $\overline{\text{BIT}}$ side is connected to the input end of inverter 410 via transistor 160. The gates of transistors 150 and 160 connected to all flipflops 40 in serial register 4 have the same activation signal applied. At the time of serial data reading and writing, this activation signal attains an H level to conduct transistors 150 and 160.

At the time of serial data reading, the outputs of the bit line BIT side and the bit line $\overline{\text{BIT}}$ side of sense amplifier 30 are latched at node a of the input end of inverter 420 and the output end of inverter 410, and node b of the input end of inverter 410 and the output end of inverter 420, respectively, in the corresponding latch circuit 40.

Serial bus line 5 comprises two data lines 100 and 110. Serial register 4 is connected to serial bus line 5 via separate N channel MOS transistors 120 and 130 for each flipflop 40. Data line 100 is connected to the input end of inverter 420 via transistor 120. Data line 110 is connected to the input end of inverter 410 via transistor 130. The gates of transistors 120 and 130 provided corresponding to each flipflop 40 are connected to serial decoder 6 via a common serial memory cell activation signal line 140. At the time of serial data reading and writing, serial decoder 6 provides a potential of the H level sequentially to each serial memory cell activation signal line 140. Therefore, at the time of serial data reading, the potential latched at node a and the potential latched at node b are transferred to data lines 100 and 110, respectively, for every flipflop 40 in serial register 4. The circuit operation of this transfer will be explained more specifically with reference to FIG. 9. FIG. 9 is a circuit diagram specifically showing the structure of flipflop 40.

Referring to FIG. 9, inverter 410 in flipflop 40 comprises a P channel MOS transistor 410a and an N channel MOS transistor 410b connected in series between power supply VC and ground GND. Similarly, inverter 420 comprises a P channel MOS transistor 420a and an N channel MOS transistor 420b connected in series between power supply VC and ground GND. At the time of serial data reading, transistors 120 and 130 are conductive when potential of an H level is applied to signal line 140. Data lines 100 and 110 are equalized to have identical potential to each other until a potential of the H level is applied to signal line 140. Data lines 100 and 110 are unequalized when potential of an H level is applied to signal line 140.

Therefore, if an H level potential and an L level potential are latched at nodes a and b, respectively, discharge is initiated from data line 110 towards ground GND via transistors 130 and 420b. This reduces the potential of data line 110 from the equalized potential (the H level). The potential of data line 110 is held at the potential (the H level) by potential of H level of node a. Thus, there is potential difference between data lines 100 and 110.

If an L level potential and an H level potential are latched at nodes a and b, respectively, discharge is initiated in data line 100 towards ground GND via transistors 120 and 410b. There is no discharge in data line 100. Therefore, the potential of data line 100 is held at the H level and the potential of data line 110 drops from the H level to generate potential difference between data lines 100 and 110.

Thus, at the time of serial data reading, there is potential difference between data lines 100 and 110 according to the latched data of flipflop 40. At the time of serial data reading, potential difference is sequentially generated between data lines 100 and 110 according to data temporarily stored in respective flipflops 40 in serial register 4. This potential difference is sensed and amplified by a sense amplifier not shown. The sensed and amplified signal of this sense amplifier is provided from serial data output terminal SDO in FIG. 6 as the read-out data.

The description of operation of the circuit of FIG. 7 at the time of serial data reading is substantially included in the above description. Therefore, the operation of the circuit of FIG. 7 at the time of serial data writing will be explained hereinafter.

At the time of serial data writing, each data applied serially to serial data input terminal SDI in FIG. 6 as the write data is provided to data lines 100 and 110 as two potentials of complementary levels.

For example, when an H level potential is applied to data line 100 and an L level potential is applied to data line 110, the potentials of nodes a and b attain an H level and an L level by the potentials of data lines 100 and 110, respectively, in the flipflop 40 corresponding to the conductive ones of transistors 120, 130. In other words, one of the write data applied serially to serial data input terminal SDI is latched in one flipflop 40. The potentials latched in nodes a and b in this flipflop 40 are applied to sense amplifier 30 provided corresponding to this flipflop 40 via transistors 150 and 160, respectively. Because sense amplifier 30 operates as a latching circuit, the two potentials temporarily stored in the corresponding flipflop 40 are applied to bit lines BIT and $\overline{\text{BIT}}$, respectively, without change in levels. As a result, the H level potential and L level potential latched in nodes a and b, respectively, in flipflop 40 corresponding to the conductive transistors 120 and 130 are provided to bit lines BIT and $\overline{\text{BIT}}$ connected to sense amplifier 30 provided corresponding to this flipflop 40. If memory cells MC connected to the selected word line WL are connected to bit lines BIT at this time, capacitor C of one of these memory cells MC is charged by potential of the H level provided to this bit line BIT. This causes an H level to be written to the node of transistor TR and capacitor C in this memory cell MC. Similarly, if memory cells MC connected to the selected word line WL are connected to bit lines $\overline{\text{BIT}}$, capacitor C of one of these memory cells MC is discharged by potential of an L level provided to bit line $\overline{\text{BIT}}$. This causes L level to be written into the node of transistor TR and capacitor C of this memory cell MC.

On the contrary, if an L level potential and an H level potential are provided to data lines 100 and 110, respectively, an L level potential and an H level potential are latched at nodes a and b, respectively, in flipflop 40 corresponding to the conductive ones of transistors 120, 130. In this case, if memory cells MC connected to the selected word line WL are connected to bit lines BIT, an L level is written into one of these memory cells MC. Similarly, if memory cells MC connected to the selected word line WL are connected to bit lines $\overline{\text{BIT}}$, an H level is written into one of these memory cells MC.

At the time of serial data writing, an H level potential is applied to all the serial memory cell activation signal lines 140, as in the case of serial data reading. During the time period when the data to be written into memory cell MC connected to the selected word line WL and the arbitrary bit line BIT or $\overline{\text{BIT}}$ are applied to data lines 100 and 110, an H level potential is applied to serial memory cell activation signal line 140 connected to the gates of transistors 120 and 130 provided corresponding to sense amplifier 30 connected to the arbitrary bit line BIT or $\overline{\text{BIT}}$. Therefore, at the time of serial data reading, each of the plurality of write data applied serially to serial data input terminal SDI is written into one of memory cells MC along one row connected to the selected word line WL. As a result, a plurality of write data are written into memory cells MC of one row connected to the selected word line WL.

Thus, at the time of serial data writing, the write data stored temporarily into each flipflop 40 in serial register 4 is transferred to memory array 2 via sense amplifiers 30. At the time of serial data reading, the readout data from memory cells MC of one row in memory array 2 are transferred to all the flipflops 40 in shift register 4. In other words, each flipflop 40 in serial register 4 functions as one memory cell storing the stored data of one memory cell MC in memory array 2. Therefore, serial register 4 functions as a memory array having a plurality of memory cells arranged in only the row direction. The number of memory cells is identical to the number of memory cells MC of one row in memory array 2. In the following description, serial register 4 and flipflop 40 are called a serial memory array and a serial memory cell, respectively.

The timing of the potential change in signal lines and nodes at the time of data transfer from memory array 2 to serial memory array 4 will be explained hereinafter with reference to FIG. 10. FIG. 10 is a timing chart for explaining the operation of the dual port memory for transferring data from memory array 2 to serial memory array 4.

Data reading from serial memory array 2 is carried out during the time period when external control signal $\overline{\text{RAS}}$ (FIG. 10(a)) is at an L level. To be more specific, a potential of H level is applied to the selected word line WL, as shown in FIG. 10(b), after the drop of external control signal $\overline{\text{RAS}}$ in memory array 2. Then, a power potential and a ground potential are applied to signal lines 350 and 360, as shown in FIGS. 10(c) and 10(d), respectively, in sense amplifier 30. This causes all sense amplifiers 30 in sense amplifier portion 3 to be activated.

Each potential of bit lines BIT (or $\overline{\text{BIT}}$) connected to memory cells MC connected to the selected word line WL slightly rises or drops according to the stored data in the memory cell MC connected thereto, as shown in FIG. 10(e). This slight potential change is amplified by sense amplifier 30 being activated.

In other words, the potential of bit line BIT (or $\overline{\text{BIT}}$) slightly rising in response to the rise of the potential of the selected word line WL rises to the power potential in response to the potential rise of signal line 350, as shown in curve 1 of FIG. 10(e). Conversely, the potential of bit line $\overline{\text{BIT}}$ (or BIT) dropping in response to the rise of the potential of the selected word line WL drops to the ground potential in response to the drop of the potential of signal line 360, as shown in curve 2 of FIG. 10(e).

The potential of bit line $\overline{\text{BIT}}$ (or BIT) which is the pair of the above-mentioned bit line BIT (or $\overline{\text{BIT}}$) having a slight rise in potential is brought to the ground potential in response to the activation of sense amplifier 30. The potential of bit line BIT (or $\overline{\text{BIT}}$) that is the pair of the bit line $\overline{\text{BIT}}$ (or BIT) where potential slightly drops is brought to the power potential in response to the activation of sense amplifier.

The activation signal applied to the gates of transistors 150 and 160 (referred to as the data transfer signal hereinafter) is at an H level for a constant short time period, as shown in FIG. 10(f). That is to say, transistors 150 and 160 conduct only during this time period, whereby each output of all the sense amplifiers 30 in sense amplifier portion 3 is transmitted to the corresponding serial memory cell 40. Therefore, stored data of each serial memory cell 40 in serial memory array 4 is switched to a new data applied from sense amplifier 30 during the time period when the data transfer signal is at an H level, as shown in FIG. 10(g). When writing the output of sense amplifier 30 into the corresponding serial memory cell 40 is completed, the potential of the selected word line WL attains an L level. In response, the two bit lines BIT and $\overline{\text{BIT}}$ forming a bit line pair are equalized, whereby the potentials of all bit lines BIT, $\overline{\text{BIT}}$ return to an intermediate potential between the power potential and the ground potential. At the same time, the potentials of signal lines 350 and 360 of FIG. 8 attain the ground potential and the power potential, respectively, to deactivate sense amplifier 30.

The timing of the potential change in signal lines and nodes at the time of transferring data from serial memory array 4 to memory array 2 will be explained hereinafter with reference to FIG. 11. FIG. 11 is a timing chart for explaining the operation of the dual port memory for transferring data from serial memory array 4 to memory array 2.

The data transfer from serial memory array 4 to memory array 2 is also carried out during the time period when external control signal $\overline{\text{RAS}}$ (FIG. 11(a)) is at an L level. The data transfer signal is at an H level for a constant short time period after external control signal $\overline{\text{RAS}}$ drops, as shown in FIG. 11(f). The write data stored in each serial memory cell 40 is applied to the corresponding sense amplifier 30 during this time period.

Sense amplifier 30 is activated after the rise of the data transfer signal. More specifically, signal lines 350 and 360 of FIG. 8 are supplied with the power potential and the ground potential, as shown in FIG. 11(c) and 11(d), respectively. The write data applied to sense amplifier 30 from serial memory cell 40 is latched in sense amplifier 30. The potentials of the two bit lines BIT and $\overline{\text{BIT}}$ forming each bit line pair change complementarily according to the data latched at the connected sense amplifier 30, as shown in FIG. 11(e). That is to say, one potential out of the two bit lines BIT and $\overline{\text{BIT}}$ forming a bit line pair (curve 1 of FIG. 11(e)) attains the power potential in response to the rise of the potential of signal 350, and the other potential (curve 2 of FIG. 11(e)) attains the ground potential in response to the drop of the potential of signal line 360.

An H level potential is provided to the selected word line WL, as shown in FIG. 11(b). As a result, each of memory cells MC of one row connected to selected word line WL has a data written according to the potential of the corresponding bit line BIT or $\overline{\text{BIT}}$. When writing data to memory array 2 is completed, the potential of the selected word line WL returns to the L level. In response, the two bit lines BIT and $\overline{\text{BIT}}$ forming a bit line pair are equalized, so that the potentials of all bit lines BIT and $\overline{\text{BIT}}$ return to the aforementioned intermediate potential. At the same time, the potentials of signal lines 350 and 360 of FIG. 8 return to the ground potential and the power potential, respectively, to deactivate sense amplifier 30.

The timing of the potential change in signal lines and nodes at the time of transferring data from data bus line 5 to serial memory array 4 will be explained hereinafter with reference to FIG. 12. FIG. 12 is a timing chart for explaining the operation of the dual port memory for transferring data from data bus line 5 to serial memory array 4.

At the time of transferring data from data bus line 5 to serial memory array 4, a potential of H level is applied from serial decoder 6 to one of serial memory cell activation signal lines 140 for a constant short time period, as shown in FIG. 12(b). During this short time period, data lines 100 and 110 are electrically connected to nodes a and b in serial memory cell 40 provided corresponding to transistors 120 and 130 having the gates thereof connected to the above mentioned one signal line 140. As a result, the potentials of nodes a and b attain potentials corresponding to the data applied to data lines 100 and 110 (FIG. 12(a)). In other words, the stored data in serial memory cell 40 is switched to a new data from data bus line 5 during the above-mentioned short time period, as shown in FIG. 12(c).

The timing of the potential change in signal lines and nodes at the time of transferring data from serial memory array 4 to serial bus line 5 will be explained hereinafter with reference to FIG. 13. FIG. 13 is a timing chart for explaining the operation of the dual port memory for transferring data from serial memory array 4 to data bus line 5.

A potential of H level is applied to one of serial memory cell activation signal lines 140 for a constant short time period, also at the time of data transfer from serial memory array 4 to serial bus line 5, as shown in FIG. 13(b). Data lines 100 and 110 are equalized until a potential of H level is supplied to any one signal line 140. Therefore, the potentials of data lines 100 and 110 both are at an H level, till the potential of the one signal line 140 rises, as shown in FIG. 13(a). When the potential of signal line 140 rises, data lines 100 and 110 are unequalized. Therefore, in response to the stored data of serial memory cell 40 provided corresponding to transistors 120 and 130 having the gates connected to signal line 140 (FIG. 13(c)), one potential (curve 2) of either of data lines 100 and 110 drops from the H level, and the other potential (curve 1) is held at the H level.

The potential change of data lines 100 and 110 and nodes a and b in serial memory cell 40 generated when data is transferred between data lines 100 and 110 and serial memory cell 40, and the potential change of nodes a and b in serial memory cell 40 generated when data is transferred between serial memory cell 40 and sense amplifier 30 will be explained in more detail with reference to FIG. 14.

FIG. 14 is a circuit diagram showing the structure of the circuit portions provided corresponding to an arbitrary bit line pair for serial data reading and writing. Sense amplifier 30 and serial memory cell 40 in FIG. 14 are represented by the circuit diagrams of FIGS. 8 and 9, respectively.

It is assumed that an H level potential and an L level potential are latched at nodes a and b, respectively, in serial memory cell 40 of FIG. 14, just before data is transferred from data lines 100 and 110 to serial memory cell 40. In this case, the following phenomenon is generated in case transistors 120 and 130 become conductive when an L level potential and an H level potential are applied to data lines 100 and 110, respectively, as write data.

Since transistors 410a and 410b are conductive just before transistors 120 and 130 conduct, current flowing from data line 110 to ground GND via transistor 420b and current flowing from power supply VC to data line 100 via transistor 410a are initiated right after transistors 120 and 130 conduct. This causes the potential of data line 110 to drop from the H level, and the potential of data line 100 to rise from the L level. It should be noted that the current capacity of data line 110 and the sizes of transistors 420a and 420b are set in advance, so that the magnitude of current applied from data line 110 of H level to node b of L level is sufficiently greater than the current flowing from node b to ground GND via the conductive transistor 420a, and that the magnitude of current applied from node b of H level to data line 110 of L level is sufficiently greater than the current flowing from power supply VC to node b via the conductive transistor 420a. Also, the current capacity of data line 100 and the sizes of transistors 410a and 410b are set in advance, so that the magnitude of the current applied from data line 100 of H level to node a of L level is sufficiently larger than the current flowing from node a to ground GND via the conductive transistor 410b, and the magnitude of the current provided from node a of the H level to data line 100 of the L level is sufficiently larger than the current flowing from power supply VC to node a via the conductive transistor 410a.

Therefore, although the potential of data line 110 slightly drops from the H level right after transistors 120 and 130 become conductive, the potential of data line 110 returns to the H level since the potential of node b immediately attains an H level by the current provided from data line 100. Similarly, the potential of data line 100 slightly rises from the L level right after transistors 120 and 130 become conductive, and then returns to L level since the potential of node a immediately attains an L level by the current drawn from node a to data line 110.

A similar phenomenon occurs when an L level potential and an H level potential are latched at nodes a and b, respectively, right before transistors 120 and 130 conduct, and when the potentials of data lines 100 and 110 attain the H and L levels, respectively.

More specifically, right after the conduction of transistors 120 and 130, the potential of data line 100 drops slightly due to the current flowing from data line 100 to ground GND via transistors 120 and 410b, and the potential of data line 110 rises slightly due to the current flowing from power supply VC to data line 110 via transistors 420a and 130. Then, the potential of data line 100 returns to the H level, due to the potential of node a attaining the H level by the current applied from data line 100 to node a. Simultaneously, the potential of data line 110 returns to the L level, due to the potential of node b attaining the L level by the current drawn from node b to data line 110.

At the time of serial data writing, if the potential levels of data lines 100 and 110 differ from those latched already in nodes a and b (that is to say, the write data externally applied to data lines 100 and 110 differ from the data already stored in serial memory cells 40), the potential (curve 1) of the data line 100 or 110 which is at the H level slightly drops in response to the rise of the potential of signal line 140, and the potential (curve 2) of the data line of the L level slightly rises in response to the rise of the potential of signal line 140.

The transfer of data from serial memory cell 40 to data lines 100 and 110 will be explained.

If H level and L level potentials are latched in advance in nodes a and b in FIG. 14, for example, current flows from data line 110 to node b via transistor 130 during the time period transistors 120 and 130 are conductive. Therefore, the potential of node b is held at a level slightly higher than an L level during this time period. This current causes the potential of data line 110 to drop to result in potential difference between data lines 100 and 110. When transistors 120 and 130 return to the non-conductive state, the current path is cut off, whereby the potential difference between data lines 100 and 110 are maintained. The potential of node b returns to the L level due to the current flowing from node b to ground GND via transistor 420b.

Conversely, if an L level potential is latched in node a, the potential of node a is held at a level slightly higher than the L level, due to the current flowing from data line 100 to node a via transistor 120 during the conductive time period of transistors 120 and 130. The potential of data line 110 gradually drops. Therefore, when transistors 120 and 130 return to the non-conductive state, the potential of node a returns to the L level due to the current flowing to transistor 410b, and the potential of data line 100 is held at the dropped potential.

Hence, at the time of data transfer from serial memory cell 40 to data lines 100 and 110, the potential of the node a or b having an L level potential latched temporarily rises during the time period when signal line 140 is at an H level potential, as shown in curve 1 of FIG. 13(c).

The transfer of data from serial memory cell 40 to the corresponding sense amplifier 30 will be explained hereinafter.

In FIG. 14, the following phenomenon will occur right after the conduction of transistors 150 and 160, when an H level potential and an L level potential are latched at nodes a and b, respectively, for example, just before the transfer of data from serial memory cell 40 to sense amplifier 30.

Sense amplifier 30 is activated after the rise of the data transfer signal, as shown in FIG. 11. This means that signal lines 350 and 360 attain the ground potential and the power potential right after transistors 150 and 160 conduct. Therefore, right after the conduction of transistors 150 and 160, transistors 330 and 320 temporarily conduct in sense amplifiers 30. As a result, current flows from node a to signal line 350 via transistors 150 and 330, and current flows from signal line 360 to node b via transistors 320 and 160. This causes the potential of node a to slightly drop and the potential of node b to slightly rise. It should be noted that sense amplifier 30 is activated during the time period when the data transfer signal attains an H level. Therefore, the current flowing from node a to the lower potential side and the current flowing from the higher potential side to node b are cut off right after the potentials of nodes a and b begin to drop or rise, respectively. As a result, the potentials of nodes a and b return to the H and L levels, respectively.

Conversely, if an L level potential and an H level potential are latched at nodes a and b, respectively, just before data is transferred from serial memory cell 40 to sense amplifier 30, a phenomenon opposite to the above described phenomenon occurs.

More specifically, right after transistors 150 and 160 conduct, the potential of node a slightly rises temporarily by the current flowing from signal line 360 to node a via transistors 340 and 150, and the potential of node b slightly drops temporarily by the current flowing from node b to signal lines 350 via transistors 160 and 310.

Thus, at the time of data transfer from serial memory cell 40 to the corresponding sense amplifier 30, the potential (curve 2) of node a or b having an H level latched drops temporarily right after the rise of the data transfer signal, and the potential (curve 1) of the other node slightly rises temporarily right after the rise of the data transfer signal, as shown in FIG. 11(g).

The value in the parenthesis of FIG. 14 is the ratio of each channel width W of the transistors forming serial memory cell 40 and the transistors forming sense amplifier 30 to the channel width of other transistors. The ratio of the channel width W set in FIG. 14 is only an example of the channel width setting of the transistors forming sense amplifier 30 and serial memory cell 40 in a conventional dual port memory.

As described in the foregoing, in a conventional semiconductor memory device having serial data writing/reading function, data is transferred between two types of memory arrays and between one of these two memory arrays and a bus line of data input/output.

The following problems are encountered in such a conventional semiconductor memory device.

To improve the readout speed of serial data in the dual port memory of FIG. 6, the data transfer speed from sense amplifier 30 to the corresponding serial memory cell 40 and the data transfer speed from serial memory cell 40 to data lines 100 and 110 in FIG. 7 should be improved.

In the case of transferring data from sense amplifier 30 to serial memory cell 40, the potentials of nodes c and d attain complementary logic levels corresponding to data readout from memory cell MC in memory array 2 to bit line BIT or $\overline{BIT}$. The potentials of nodes a and b are held at the potentials applied from data lines 100 and 110 or from sense amplifier 30. Therefore, the potentials of nodes a and b may differ from those of nodes c and d, respectively. The case will be considered hereinafter where transistors 150 and 160 conduct when an H level potential and an L level potential are latched at nodes a and b, respectively, and when the potentials of nodes c and d are at L and H levels, respectively.

When transistors 150 and 160 conduct, node a has current drawn by transistors 340 to signal line 360 which is at the power potential, and current applied from power supply VC by transistor 410a. Simultaneously, node b has current provided from signal line 350 which is at the power potential by transistor 310, and current drawn by transistor 420b to ground GND. Therefore, the potentials of nodes a and b will immediately drop and rise, respectively, but will not be equal to the potential level of nodes c and d. The potentials of nodes a and b are applied to the gate node of transistors 420a and 420b, and to the gate node of transistors 410a and 410b, whereby transistors 410a and 410b will become non-conductive and conductive afterwards, respectively, in response to the rise in potential of node b. Transistors 420a and 420b will become conductive and non-conductive, respectively, afterwards, in response to the drop in potential of node a. Therefore, the potentials of nodes a and b eventually stabilize at the H level and the L level, respectively.

Therefore, in order to speed data transfer from sense amplifier 30 to serial memory cell 40, the current flowing to node a from power supply VC via transistor 410a and the current flowing from node b to ground GND via transistor 420b should be reduced to obtain a faster potential drop in node a and a faster potential rise in node b.

The case will be considered where transistors 150 and 160 conduct when an L level potential and an H level potential are latched at nodes a and b, and when nodes c and d are at the H level and the L level, respectively.

When transistors 150 and 160 conduct, the current flowing to ground GND from node a via transistor 410b prevents the potential of node a from being immediately brought to an H level, and the current flowing to node b from power supply VC via transistor 420a prevents the potential of node b from being immediately brought to the L level. To transfer data from sense amplifier 30 to serial memory cell 40 at a high rate, therefore, the current flowing from node a to ground GND via transistor 410a and the current flowing from power supply VC to node b via transistor 420a should be reduced to improve the potential rise speed of node a by the current provided to node a from signal line 350 and to improve the potential drop speed of node b by the current flowing from node b to signal line 360.

It can be understood from the foregoing that the current flowing between the source and drain of each of transistors 410a, 410b, 420a and 420b at the time of conduction should be reduced to improve the data transfer speed from sense amplifier 30 to serial memory cell 40. For this purpose, the size, for example the channel width W of each of transistors 410a, 410b, 420a, and 420b, should be reduced. The magnitude of current flowing between the source and drain of a MOS transistor turned on increases according to channel width W of the MOS transistor. The drive capability of a MOS transistor is the amount of current that can flow across the source and drain thereof.

FIG. 15 is a sectional view and a plan view of an MOS transistor. FIGS. 15(a) and (b) show relative MOS transistors having a short channel length and a long channel length, respectively.

Referring to FIG. 15, the MOS transistor comprises a conductor layer (shaded in the drawing) as a gate G formed with a constant width of L on a semiconductor substrate 500, and two impurity diffusion layers (dotted in the drawing) at semiconductor substrate 500 at right angles with the conductor layer, as the source S and drain D. The channel of the MOS transistor is formed in the conductive layer sandwiched by the two impurity diffusion layers. Channel current flows through this portion. The channel length of the MOS transistor corresponds to the width of the conductor layer, i.e. the gate width L. The channel width of the MOS transistor corresponds to the width of the impurity diffusion layer, i.e. the width W of the source/drain.

The cross sectional area in the direction (shown by a chain dotted line B in the figure) at right angles with the channel current flow of the channel region (enclosed in bold line in the figure) becomes greater according to the increase of channel width W. Therefore, if the voltage between the source and drain is constant, the magnitude of current flowing across the source and drain is proportional to the channel width W.

It can be appreciated by comparing FIGS. 15(a) and (b) that the resistance in the direction parallel to the channel current flow in the channel region increases according to the channel length L. Therefore, if the voltage across the gate and source is constant, the magnitude of current flowing across the source and drain is inversely proportional to channel length L.

FIG. 16 is a graph showing the relation between a current $I_{DS}$ across the source and gate and a voltage $V_{GS}$ across the gate and source of two MOS transistors having different channel lengths (i.e. gate width) L. Curves 1 and 2 show an N channel MOS transistor having a small gate width L, and an N channel MOS transistor having a great gate length L, respectively.

It can be appreciated from FIG. 16 that a transistor of a smaller gate width L has a greater change in current $I_{DS}$ flowing across the source and drain when the gate potential is raised while the source is grounded in an N channel MOS transistor. On comparing two arbitrary MOS transistors having the same voltage between source and gate, the current across the source and drain of a MOS transistor of a small gate width L is greater than that of a MOS transistor having a large gate width L. This means that the drive capability of a MOS transistor is adjustable by changing the gate width L.

In the case of comparing two MOS transistors having different thicknesses T of gate G, the electric field generated at the channel region of the transistor with a thin gate G thickness T is greater than that of the transistor with a thick gate G thickness T, if the voltage $V_{GS}$ applied across the gate and source is identical. This means that the current across the source and the drain increases as the thickness T of gate G is thinner. The drive capability of a MOS transistor can also be adjusted by changing the thickness T of gate G.

If the transistor operation speed of data from sense amplifier 30 to serial memory cell 40 is improved according to the decrease of the drive capability of transistors 410a, 410b, 420a and 420b, data transfer from serial memory array 40 to serial bus line 5 can not be carried out appropriately.

The case is considered where transistors 120 and 130 conduct when an H level potential and an L level potential are latched at nodes a and b, respectively. When transistors 120 and 130 conduct, the potential of data line 110 begins to drop by the current flowing from data line 110 to ground GND via transistors 130 and 420b. As a result, the potential difference generated between data lines 100 and 110 is amplified by a sense amplifier as the readout data. To readout data stored temporarily in serial memory cell 40 to data lines 100 and 110 at a high speed, the current flowing from data line 110 to ground GND via transistors 130 and 420b should be increased to increase the rate of drop of potential of data line 100. In other words, current flowing across transistor 420b should be increased.

In the case transistors 120 and 130 conduct when an L level potential and an H level potential are latched at nodes a and b, respectively, the potential of data line 100 begins to drop by the current flowing from data line 110 to ground GND via transistors 120 and 410b, opposite to the above-described case. Therefore, the potential drop speed of data line 110 should be improved by increasing the current flowing to ground GND via transistor 410b, in order to transfer data at a high rate from serial memory cell 40 to data lines 100 and 110.

It can be understood from the foregoing that the size, for example the channel width W of N channel transistors 410b and 420b in serial memory cell 40 should be increased to improve the transfer rate of data from serial memory cell 40 to serial bus line 5.

However, if transistors 410b and 420b are designed in small sizes in order to speed data transfer from sense amplifier 30 to serial memory cell 40, the potential drop speed of data line 100 or 110 becomes slower since the current flowing across transistors 410b and 420b is small at the time of data transfer from serial memory cell 40 to data lines 100 and 110. As a result, the transfer rate of data from serial memory cell 40 to data lines 100 and 110 is decreased, and data may not be readout properly due to potential difference between data lines 100 and 110 being reduced.

If the size of transistors 410b and 420b are increased to facilitate data transfer from serial memory cell 40 to serial bus line 5, the transfer rate of sense amplifier 30 to serial memory cell 40 is decreased, and transfer of data from data lines 100 and 110 to serial memory cell 40 may not be carried out appropriately.

In FIG. 14, if transistors 120 and 130 conduct when the potentials of data lines 100 and 110 are at an L level and an H level, respectively, by the write data, and potentials of nodes a and b are at an H level and an L level by the data previously latched at serial memory cell 40, current flows from data line 110 to ground GND via transistors 130 and 420b and current flows from power supply VC to data line 100 via transistors 410a and 120. Accordingly, the current flowing from power supply VC to node a via transistor 410a prevents the potential of node a from dropping to the L level. Similarly, the current flowing from node b to ground GND via transistor 420b prevents the potential of node b from rising to the H level. Therefore, in order to facilitate data transfer from data lines 100 and 110 to serial memory cell 40, the current flowing from power supply VC to node a via transistor 410a and the current flowing from node b to ground GND via transistor 420b should be minimized. In other words, the size, channel width W for example, of transistors 410a and 420b should be as small as possible.

In the case transistors 120 and 130 conduct when the potentials of data lines 100 and 110 are at the H and L level, respectively, and the potential of nodes a and b are at the L and H level, respectively, the current flowing from node a to ground GND via transistor 410b prevents the potential of node a from rising to the H level by the potential of data line 100, and the current flowing from power supply VC to node b via transistor 420a prevents the potential of node b from dropping to the L level by the potential of data line 110. In order to facilitate data transfer from data lines 100 and 110 to serial memory cell 40, therefore, the current flowing from node a to ground GND via transistor 410b and the current flowing from power supply VC to node via transistor 420a should be as small as possible. In other words, the size, the channel width W for example of transistors 410a and 420b should be as small as possible.

It can be understood from the foregoing that the size, the channel width W, for example, of transistors 410a, 410b, 420a and 420b forming serial memory cell 40 should be reduced in order to facilitate data transfer from data lines 100 and 110 to serial memory cell 40. Such a size setting is opposite to that of facilitating data transfer from serial memory cell 40 to data lines 100 and 110. If the size of the transistors in serial memory cell 40 are defined to facilitate data transfer from serial memory cell 40 to serial bus line 5, data transfer from serial bus line 5 to serial memory cell 40 may not be carried out appropriately. This generates the problem that the data transfer rate from serial bus line 5 to serial memory cell 40 is decreased, and that the potentials of nodes a and b will not reach the potential levels of data lines 100 and 110, respectively, whereby data will not be transferred from serial bus line 5 to serial memory cell 40.

Thus, data transfer from sense amplifier 30 to the corresponding serial memory cell 40, and data transfer from serial memory cell 40 to serial bus line 5 cannot be implemented with ease for serial data reading. Also, data transfer from serial bus line 5 to serial memory cell 40 for serial data writing and data transfer from serial memory cell 40 to serial bus line 5 for serial data reading cannot be implemented together with ease. In a conventional semiconductor memory device comprising serial data reading/writing function, therefore, it was difficult to improve the serial data reading rate and both the serial data reading/writing rate.

In a conventional semiconductor memory device, two data lines (data lines 100 and 110 in FIG. 14) are used for data input from an external source and data output to an external source. This will increase the occupying area of serial bus line 5 on dual port memory chip 1 of FIG. 6, for example, to reduce the area allocated for other functional components in chip 1. Accordingly, increase in memory capacity of semiconductor memory devices is hindered.

SUMMARY OF THE INVENTION

An object of the present invention is to provide a semiconductor memory device allowing improvement in serial data reading speed.

Another object of the present invention is to provide a semiconductor memory device allowing improvement in serial data writing speed.

A further object of the present invention is to provide a semiconductor memory device having both serial data writing speed and serial data reading speed improved.

A still further object of the present invention is to provide a dual port memory where both data transfer from a sense amplifier to a serial memory cell and data transfer from a serial memory cell to a serial bus line are carried out with ease.

Yet another object of the present invention is to provide a dual port memory where both data transfer from a serial bus line to a serial memory cell and data transfer from a serial memory cell to a serial bus line are carried out with ease.

An additional object of the present invention is to provide a dual port memory where data transfer between a serial bus line and a serial memory cell, and data transfer from a sense amplifier to a serial memory cell are both carried out with ease.

Another object of the present invention is to provide a semiconductor memory device where the occupying area on a semiconductor substrate of data lines provided for applying data from and to an external source is small.

For achieving the above objects, according to an aspect of the present invention, a semiconductor memory device includes a first memory array comprising a plurality of first memory cells arranged in a plurality of columns, a second memory array for temporarily storing a stored data signal in the first memory array and a write data signal to be written into the first memory array, a read out circuit for reading out a data signal from the first memory cell, a limiting circuit and a data bus for providing the stored data signal from the first memory array to an external source and for receiving the write data signal from an external source. The second memory array includes a plurality of second memory cells provided corresponding to the plurality of columns of the first memory array. Each of the second memory cells includes first and second complementary storage nodes, and a bidirectional inverting circuit interconnecting the first and second storage nodes. The limiting circuit limits the magnitude of current flowing within the inverting circuit in one direction to be less than that within the inverting circuit in the opposite direction.

The semiconductor device further includes an amplifying circuit for sensing and amplifying data signals read out by the read out circuits and data signals temporarily stored in the second memory cells, a first connecting circuit, a second connecting circuit, and a third connecting circuit. The first connecting circuit electrically connects the amplifying circuit and the first storage node at the time of data reading and writing. The second connecting circuit electrically connects the second storage node to the data bus, after the first storage node and the amplifying circuit are electrically connected, at the time of data reading. The third connecting circuit electrically connects the data bus to the first storage node, before the first storage node and the amplifying circuit are connected by the first connecting circuit, at the time of data writing.

In a semiconductor memory device of the present described structure according to the present invention, a read out data signal from a first memory cell of an arbitrary column is amplified by an amplifying circuit and then applied to the first storage node of the second memory cell corresponding to that column.

At this time, if the magnitude of current flowing from the first storage node to the inverting circuit is limited to a small value, the potential of the first storage node rapidly rises by the current flowing from the amplifying circuit to the first storage node. If the magnitude of current flowing from the inverting circuit to the first storage node is limited to a small value, the potential of the first storage node rapidly falls by the current flowing from the first storage node to the amplifying circuit. Thus, the potential of the first storage node rapidly becomes a potential corresponding to the read out data signal if the current flowing between the first storage node and the inverting circuit is limited to a small value.

Thereafter, by the operation of the inverting circuit, complementary voltage signals corresponding to the read out data signal are temporarily stored in the first and second storage nodes. Afterwards, the temporarily stored data signal in the first storage node is transferred to the data bus by the inverting circuit as the read out data of the first memory cell. At this time, if the current flowing from the inverting circuit to the second storage node is great, the potential of the data bus rapidly rises. If the current flowing from the second storage node to the inverting circuit is great, the potential of the data bus rapidly falls. Thus, the potential of the data bus rapidly changes according to the potential of the first storage node when the current flowing between the second storage node and the inverting circuit is great.

Conversely, at the time of data writing, the write data signal provided to the data bus is applied to the first storage node of the second memory cell. At this time, if the current flowing from the inverting circuit to the first storage node is limited to a small value, the potential of the first storage node rapidly falls according to the current flowing from the first storage node to the data bus. If the current flowing from the first storage node towards the inverting circuit is limited to a small value, the potential of the first storage node rapidly rises according to the current flowing from the data bus to the first storage node. Thus, the potential of the first storage node rapidly attains a potential corresponding to the write data signal when the current flowing between the first storage node and the inverting circuit is limited to a small value.

Thereafter, by the operation of the inverting circuit, complementary voltage signals corresponding to the write data signal are temporarily stored in the first and second storage nodes. Afterwards, the data signal temporarily stored in the first storage node is amplified by the amplifying circuit to be written into the first memory cell.

According to another aspect of the invention, a semiconductor memory device according to the present invention includes a first memory array comprising a plurality of first memory cells arranged in a plurality of columns, a second memory array for temporarily storing a stored data signal in the first memory array and a write data signal to be written into the first memory array, a readout circuit for reading out a data signal from the first memory cell, and a data bus for providing the stored data signal from the first memory array to an external source and for receiving the write data signal from an external source. The second memory array includes a plurality of second memory cells provided corresponding to the plurality of columns of the first memory array. Each of the second memory cells includes a first node, a second node, a first inverting circuit for inverting the potential of the first node and providing the same to the second node, and a second inverting circuit for inverting the potential of the second node and providing the same to the first node. The drive capability of the first inverting circuit is greater than that of the second inverting circuit.

The semiconductor memory device further includes an amplifying circuit for sensing and amplifying data signals read out by the readout circuits and data signals temporarily stored in the second memory cells, a first connecting circuit, a second connecting circuit, and a third connecting circuit. The first connecting circuit electrically connects the amplifying circuit and the first node at the time of data reading and writing. The second connecting circuit electrically connects the second node to the data bus, after the first node and the amplifying circuit are electrically connected, at the time of data reading. The third connecting circuit electrically connects the data bus to the first node, before the first node and the amplifying circuit are connected by the first connecting circuit, at the time of data writing.

In a semiconductor memory device of the above described structure according to the present invention, a readout data signal from a first memory cell of an arbitrary column is amplified by an amplifying circuit and then applied to the first node of the second memory cell corresponding to that column. Because the drive capability of a second inverting circuit is low, the potential of the first node is not affected by the output of the second inverting circuit to quickly become a potential corresponding to the readout data signal. By the inverting operation of the first and second inverting circuits, complementary voltage signals corresponding to the readout data signal are temporarily stored in the first and second nodes. Then, the data signal temporarily stored in the first node is transferred to the data bus by the first inverting circuit as the readout data from the first memory cell. The drive capability of the first inverting circuit is high so that the potential of the data bus quickly changes according to the potential of the second node. At the time of data writing, the write data signal provided to the data bus is applied to the first node of the second memory cell. The drive capability of the second inverting circuit is low so that the potential of the first node is not affected by the output of the second inverting circuit to quickly become a potential corresponding to the write data signal. Then, complementary voltage signals according to the write data signal are temporarily stored in the first and second nodes by the inverting operation of the first and second inverting circuits. Then, the data signal temporarily stored in the first node is amplified by the amplifying circuit and written into the first memory cell.

According to a preferred embodiment, the first inverting circuit in each second memory cell includes first and second field effect semiconductor elements of complementary polarity connected in series between a high potential power supply and a low potential power supply. The second inverting circuit includes third and fourth field effect semiconductor elements connected in series between the high and low potential power supplies, and having a polarity identical to that of the first and second field effect semiconductor elements, respectively. The size of the first field effect semiconductor element is larger than that of the third field effect semiconductor element. The size of the second field effect semiconductor element is larger than that of the fourth field effect semiconductor element.

According to another preferable embodiment, each of the second memory cells comprises a first inverting circuit having a plurality of inverters connected in parallel between the first storage node and the second storage node, and a second inverting circuit having a single inverter connected between the first and second storage nodes in anti-parallel to the plurality of inverters.

The first memory array further includes first and second bit lines provided corresponding to each of a plurality of columns. Each stored data signal in the plurality of first memory cells are readout by the readout circuit to the first and second bit lines corresponding to the column in which they are arranged. The amplifying circuit includes a sense amplifier provided corresponding to each of the plurality of columns. Each sense amplifier includes fifth and sixth field effect semiconductor elements of complementary polarity provided between the corresponding first bit line and the first signal line and between the corresponding first bit line and second signal line, respectively, and having the conductive state controlled according to the potential of the second bit line; and seventh and eighth field effect semiconductor elements of complementary polarity provided between the corresponding second bit line and the first signal line and between the corresponding second bit line and second signal line, respectively, and having the conductive state controlled according to the potential of the first bit line. The polarity of the seventh field effect semiconductor element is identical to that of the fifth field effect semiconductor element. The polarity of the eighth field effect semiconductor element is identical to that of the sixth field effect semiconductor element. At the time of data writing, first and second signal lines are applied with high and low potentials, respectively, after the first node and the amplifying circuit are electrically connected by the first connecting circuit. At the time of data reading, the first and second signal lines are applied with high and low potentials, respectively, before the first node and the amplifying circuit are electrically connected by the first connecting circuit.

The first connecting circuit includes data transfer MOS transistors each connected between the sense amplifier and the second memory cell provided corresponding to each column. The data transfer MOS transistor is controlled to conduct only at the time of data writing and the data reading.

The second connecting circuit includes a plurality of data reading MOS transistors, each connected between the relevant second node and the data bus. This read MOS transistor is controlled to conduct after the corresponding transfer MOS transistor is conductive at the time of data reading.

The third connecting circuit includes a plurality of data writing MOS transistors, each connected between the respective first node and the data bus. This writing MOS transistor is controlled to conduct before the corresponding transfer MOS transistor is conductive, at the time of data writing. The data bus is formed of a single signal line.

Preferably, all the transfer MOS transistors conduct simultaneously, and the reading and writing MOS transistors conduct sequentially over time. Each first memory cell includes, for example, a MOS transistor and a capacitor connected in series between the first and second bit lines and the low potential power supply. The MOS transistors of the first memory cells arranged in the same row are connected to the same word line. A MOS transistor, for example, is adapted for each of the first to eighth field effect semiconductor elements. In this case, the size ratio of the first to eighth field effect semiconductor elements can be changed by adjusting the channel width thereof, for example.

According to another aspect of the present invention, a semiconductor memory device includes a memory array having a plurality of memory cells arranged in a plurality of columns, a data bus allowing data signal reception/transmission between the memory cell and an external source, an amplifying circuit for amplifying a data signal from the memory cell, a first electrical path provided corresponding to each of the plurality of columns for allowing the transfer of data signal from a memory cell arranged in the corresponding column from the amplifying circuit to the data bus, and a second electrical path differing from the first electrical path provided corresponding to each of the plurality of columns, for allowing transfer of a data signal to be written into a memory cell arranged in the corresponding column from the data bus to the amplifying circuit.

As set forth in the above described present invention, the path through which the data signal read out from the first memory array is transferred to the data bus and the path through which the data signal written into the data bus is transferred to the first memory array differs from each other in transfer of the data signal between the data bus and the second memory array. Therefore, the problem of not being able to transfer data from the data line to the second memory cell appropriately is eliminated even if the drive capability of one inverting circuit out of the first and second inverting circuits included in the second memory cell is increased. Also, the problem of not being able to transfer data from the second memory cell to the data bus appropriately is eliminated even if the drive capability of the other inverting circuit is reduced. As a result, the data readout speed is improved since data is transferred easily from the first memory array to the second memory array and from the second memory array to the data bus at the time of data reading. The data writing speed is also improved since data is easily transferred from the data bus to the first memory array at the time of data writing.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 11(a)-(g) are a timing chart for explaining the circuit operation for transferring data from a serial memory cell to the corresponding sense amplifier in FIG. 7.

FIGS. 12(a)-(c) are a timing chart for explaining the circuit operation for transferring data from data lines to a serial memory cell in FIG. 7.

FIGS. 13(a)-(c) are a timing chart for explaining the circuit operation for transferring data from a serial memory cell to data lines in FIG. 7.

FIG. 18 is a circuit diagram showing in detail the structure of inverter 440 of FIG. 17.

DESCRIPTION OF THE PREFERRED EMBODIMENTS

The present invention is generally applicable to a semiconductor integrated circuit device that reads out data from a memory array to transfer the temporarily stored data to another circuit.

The present invention will be explained in details according to the preferred embodiments.

Figure 1:
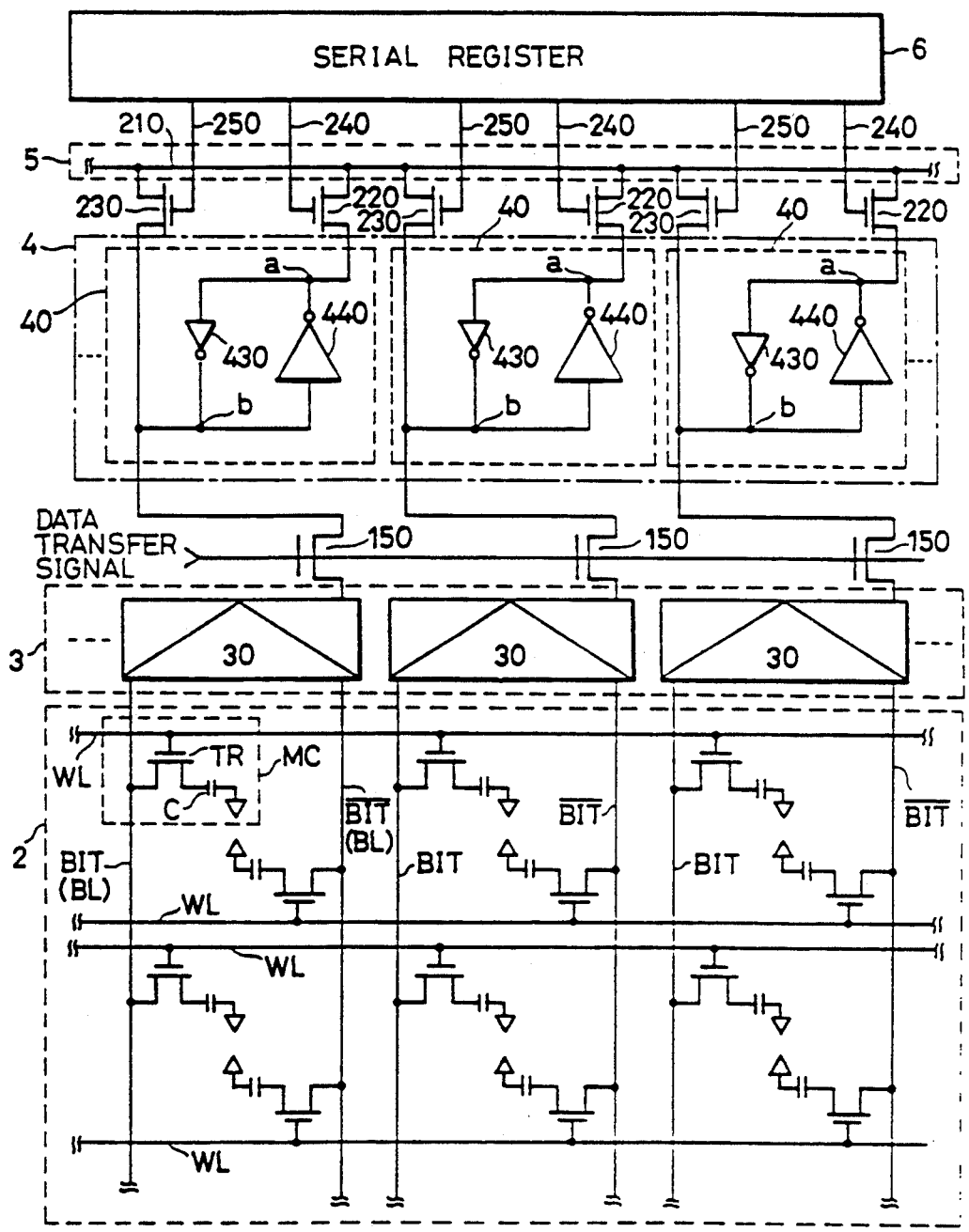
FIG. 1 is a block diagram schematically showing the component structure of a dual port memory according to an embodiment of the present invention.
Figure 6:
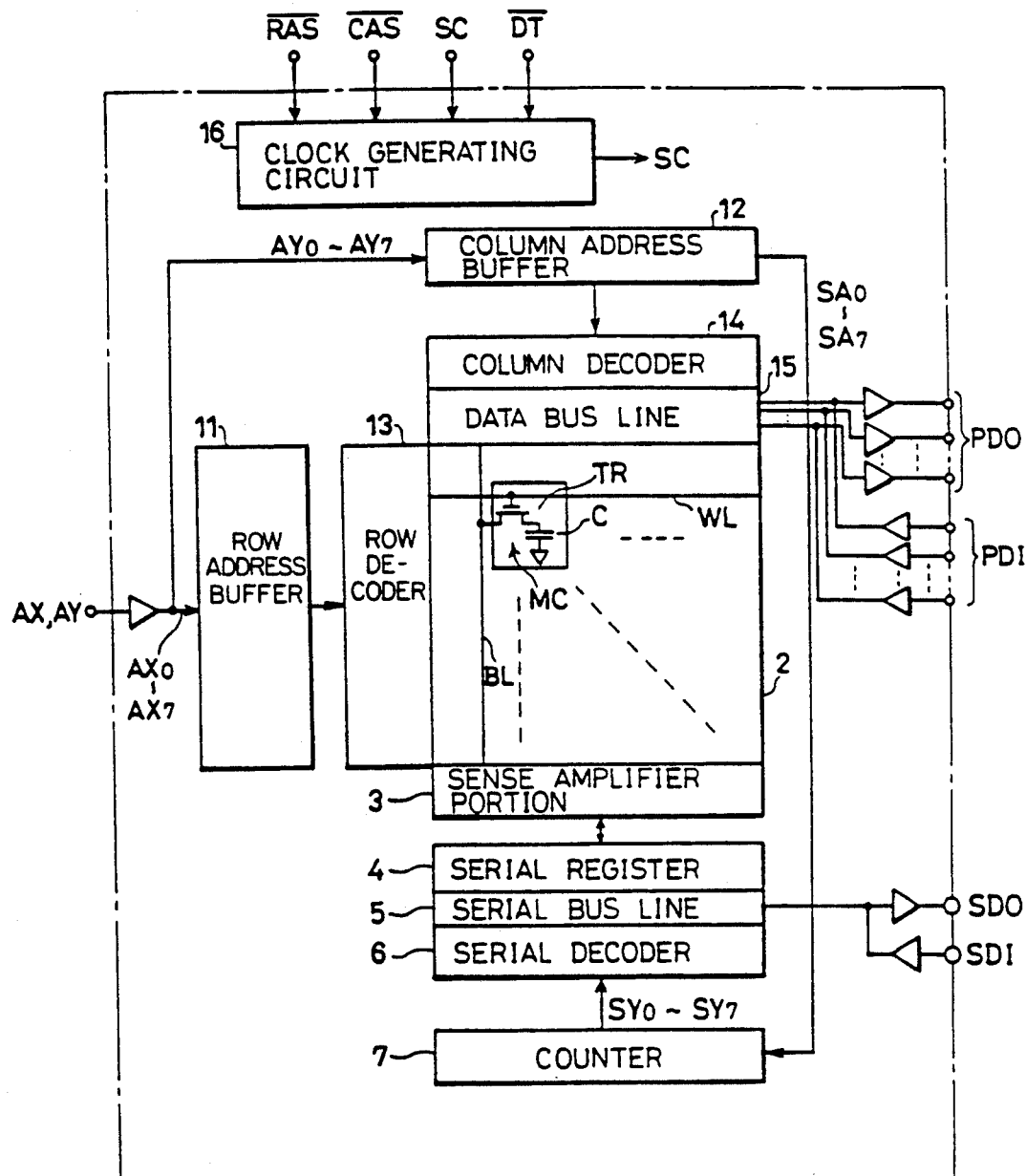
FIG. 6 is a block diagram of the entire structure of a conventional dual port memory.

FIG. 1 is a circuit diagram showing the component structure of a dual port memory according to an embodiment of the present invention. The entire structure of this dual port memory is similar to that shown in FIG. 6. The structures of memory array 2, sense amplifier portion 3, serial register 4, and serial bus line 5 of FIG. 6 are shown mainly in FIG. 1.

In FIG. 1, memory array 2 and sense amplifier 3 have structures similar to conventional ones so their descriptions will not be repeated.

Figure 7:
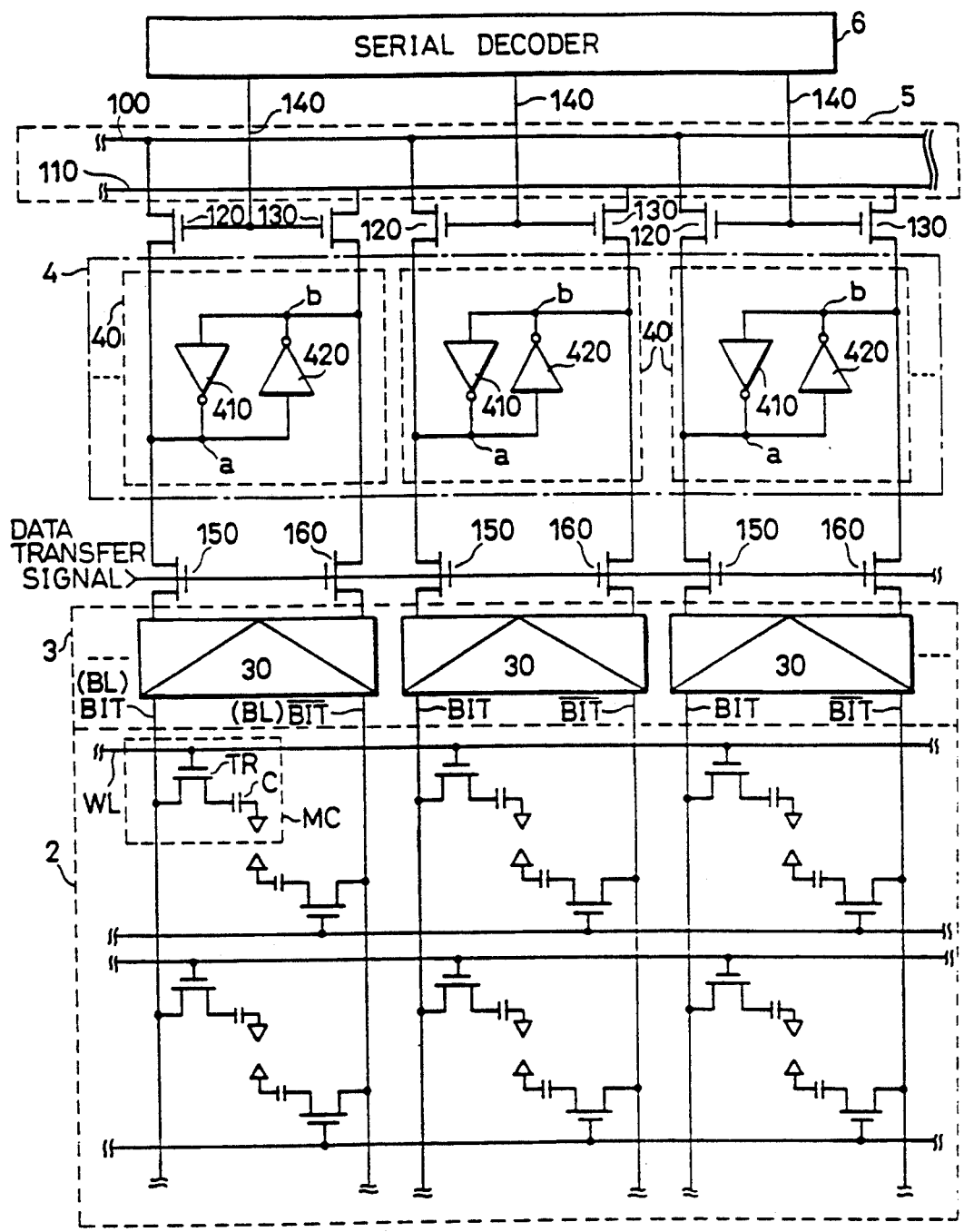
FIG. 7 is a circuit diagram of a proportional structure of a conventional dual port memory.

In comparison with FIGS. 1 and 7, the dual port memory of the present embodiment differs from a conventional dual port memory in that serial bus line 5 is constituted by a single data line 210, and only one of the two outputs of sense amplifier 30 is connected to the corresponding serial memory cell 40 via N channel MOS transistor 150. Each serial memory cell 40 is connected to data line 210 via two N channel MOS transistors 220 and 230. The gates of transistors 220 and 230 are connected to serial decoder 6 via a read selecting signal line 240 and a write selecting signal line 250 differing from each other.

Figure 14:
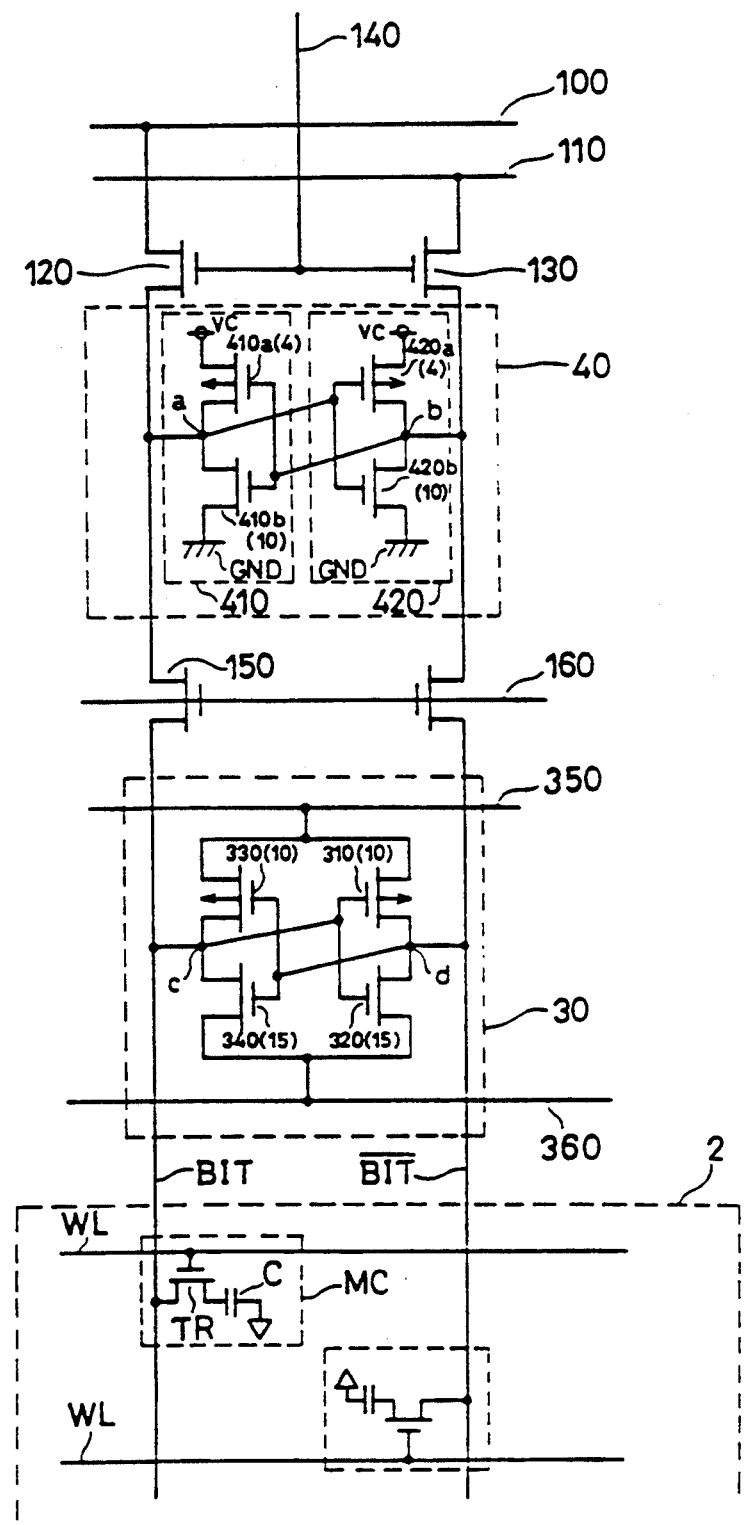
FIG. 14 is a circuit diagram showing in detail a structure of a circuit for serial data reading and writing, provided corresponding to an arbitrary bit line pair of FIG. 7.
Figure 15:
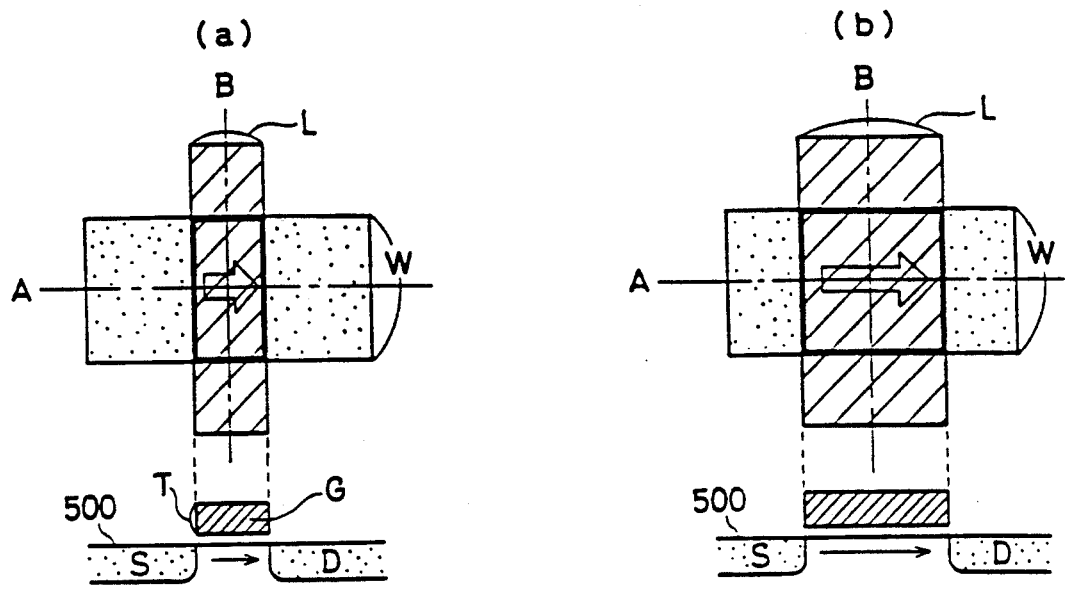
FIGS. 15(a)-(b) are a plan view and a sectional view of the structure of a MOS transistor.
Figure 16:
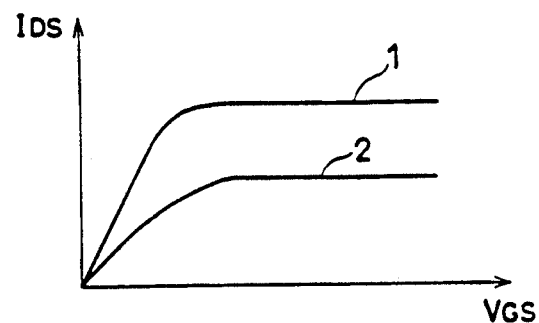
FIG. 16 is a graph showing the relation between the voltage between the gate and the source and the current across the drain and the source current of a MOS transistor.

The significant difference between this dual port memory and a conventional dual port memory is that each serial memory cell 40 is formed by two inverters 430 and 440 having different drive capabilities. The drive capability of an inverter refers to the magnitude of current which the inverter can provide to and draw from the node connected thereto. Accordingly, the drive capability of an inverter depends upon the drive capability of the transistor forming this inverter. For example, in the conventional dual port memory of FIG. 14, the size of P channel transistor 410a included in inverter 410 is equal to that of P channel transistor 420a included in inverter 420, and the size of N channel transistor 410b included in inverter 410 is equal to that of N channel transistor 420b included in inverter 420. Thus, when the sizes of the transistors of the same polarity are equal between two inverters, the drive capability of the two inverters are equal.

Figure 2:
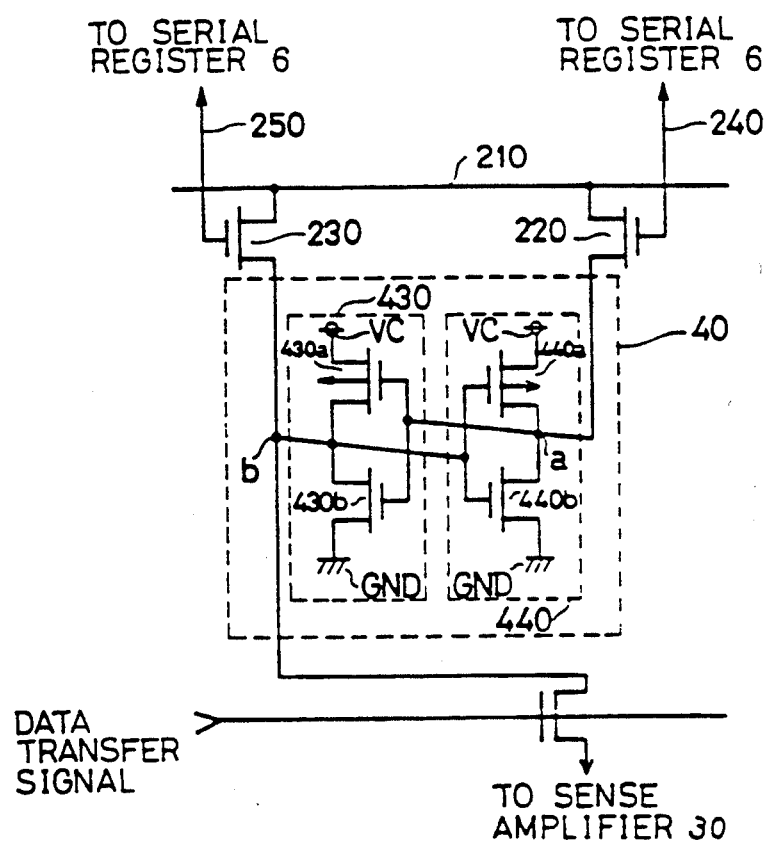
FIG. 2 is a circuit diagram showing in detail the structure of a serial memory cell 40 of FIG. 1.

FIG. 2 is a circuit diagram specifically showing a structure of an arbitrary serial memory cell 40 of FIG. 1. Referring to FIG. 2, an inverter 430 comprises a P channel MOS transistor 430a and an N channel MOS transistor 430b connected in series between power supply VC and ground GND in serial memory cell 40. Similarly, inverter 440 comprises a P channel MOS transistor 440a and an N channel MOS transistor 440b connected in series between power supply VC and ground GND. The size of P channel transistor 430a included in inverter 430 is smaller than that of P channel transistor 440a included in inverter 440, and the size of N channel transistor 430b included in inverter 430 is smaller than that of N channel transistor 440b included in inverter 440. Similarly to a conventional case, the two inverters 430 and 440 forming serial memory cell 40 have respective input ends connected to respective output ends of each other to form a flipflop.

Referring to FIG. 1 again, sense amplifier 30 is connected to the input end of inverter 440 in the corresponding serial memory cell 40 via transistor 150. The output end of inverter 430 is connected to data line 210 via transistor 230. The output end of inverter 440 is connected to data line 210 via transistor 220.

The operation of the dual port memory of the present invention will be explained hereinafter. The operation for parallel data reading and writing is similar to that of a conventional dual port memory, and the description will not be repeated. The operation of serial data reading and writing will be explained hereinafter.

Row address buffer 11 and row decoder 13 of FIG. 6 operate in a conventional manner, whereby the potential of all bit lines BIT or $\overline{BIT}$ rises or drops according to each stored data in memory cells MC of one row connected to an arbitrary word line WL in memory array 2 of FIG. 1. This causes the potential difference generated between the two bit lines of BIT and $\overline{BIT}$ forming each bit line pair to be amplified to the voltage between the power potential and the ground potential by a conventional operation of sense amplifier 30. More specifically, in FIG. 8, when there is potential rise in bit line BIT due to the stored data in memory cell MC connected to the selected word line WL, the potential of node c rises to the power potential applied to signal line 350, and the potential of node d drops to the ground potential applied to signal line 360.

Figure 8:
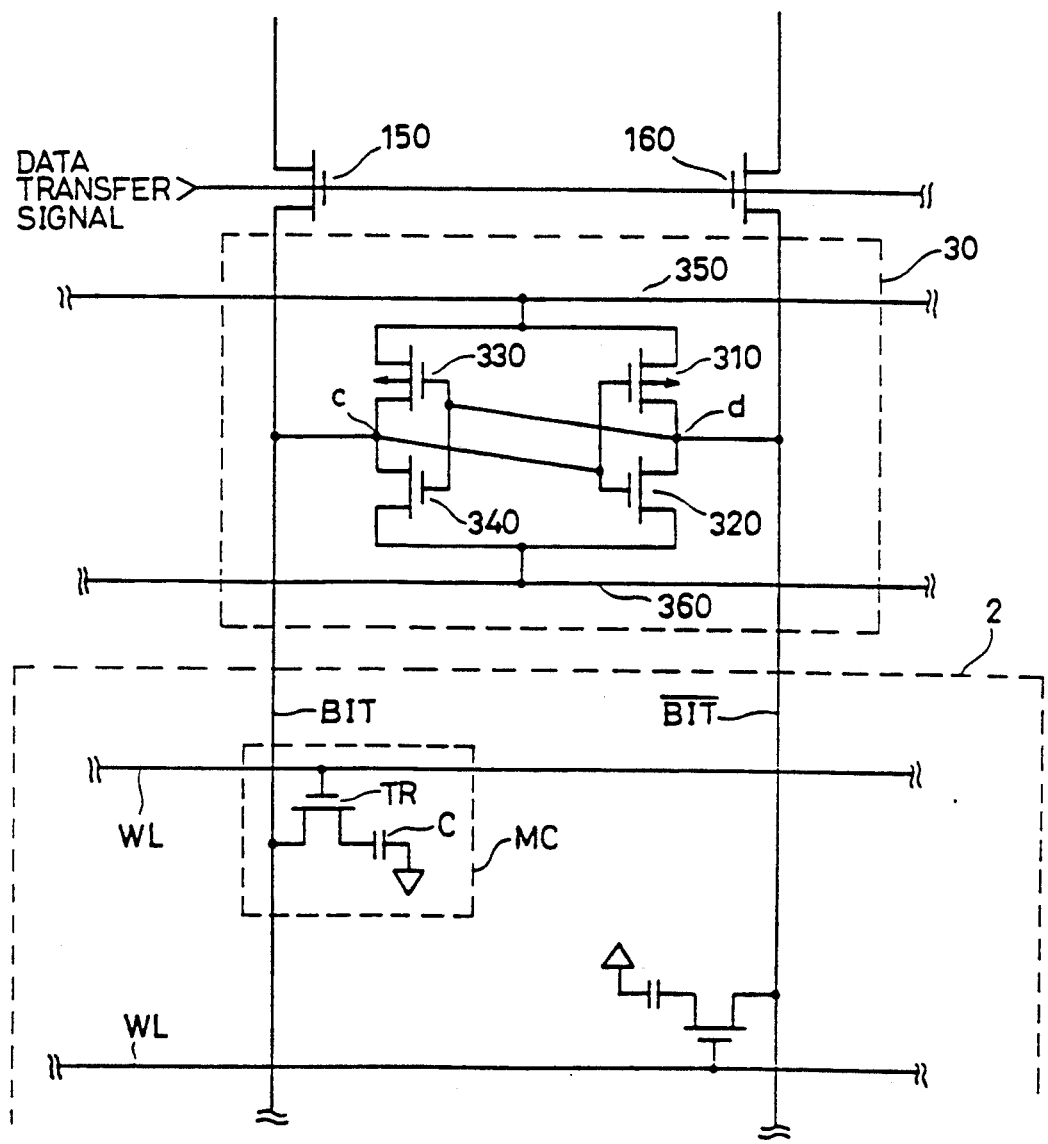
FIG. 8 is a circuit diagram showing in detail a structure of a sense amplifier 30 of FIG. 7.
Figure 9:
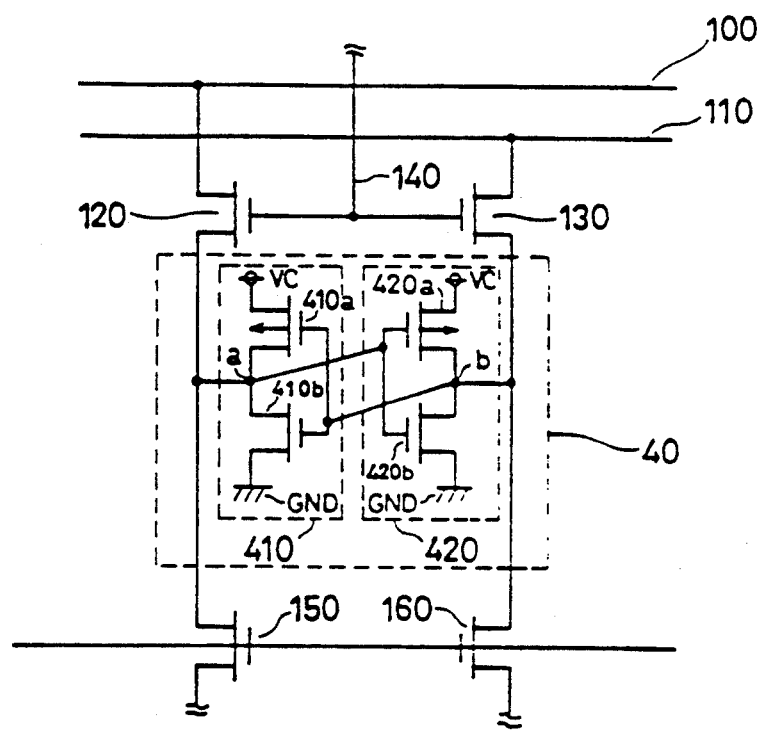
FIG. 9 is a circuit diagram showing in detail a structure of a serial memory cell of FIG. 7.
Figure 10:
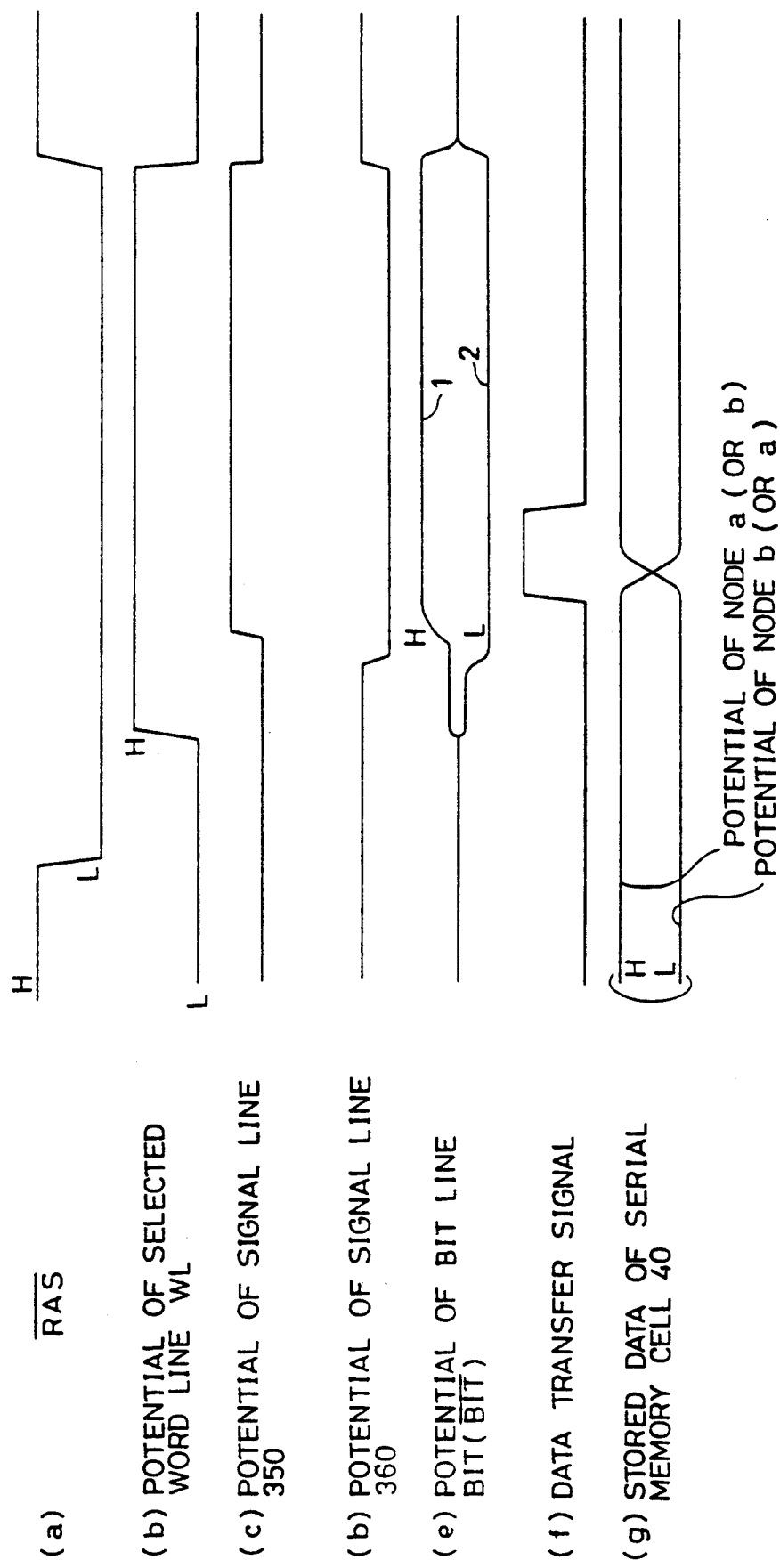
FIGS. 10(a)-(a) are a timing chart for explaining the circuit operation for transferring data from a sense amplifier to the corresponding serial memory cell.

The readout data amplified by sense amplifier 30, i.e. one of node c and node d in FIG. 8, is applied to serial memory cell 40 via transistor 150 of FIG. 1 as the output of sense amplifier 30. The circuit operation for transferring data from sense amplifier 30 to serial memory cell 40 will be explained hereinafter with reference to FIG. 3.

Figure 3:
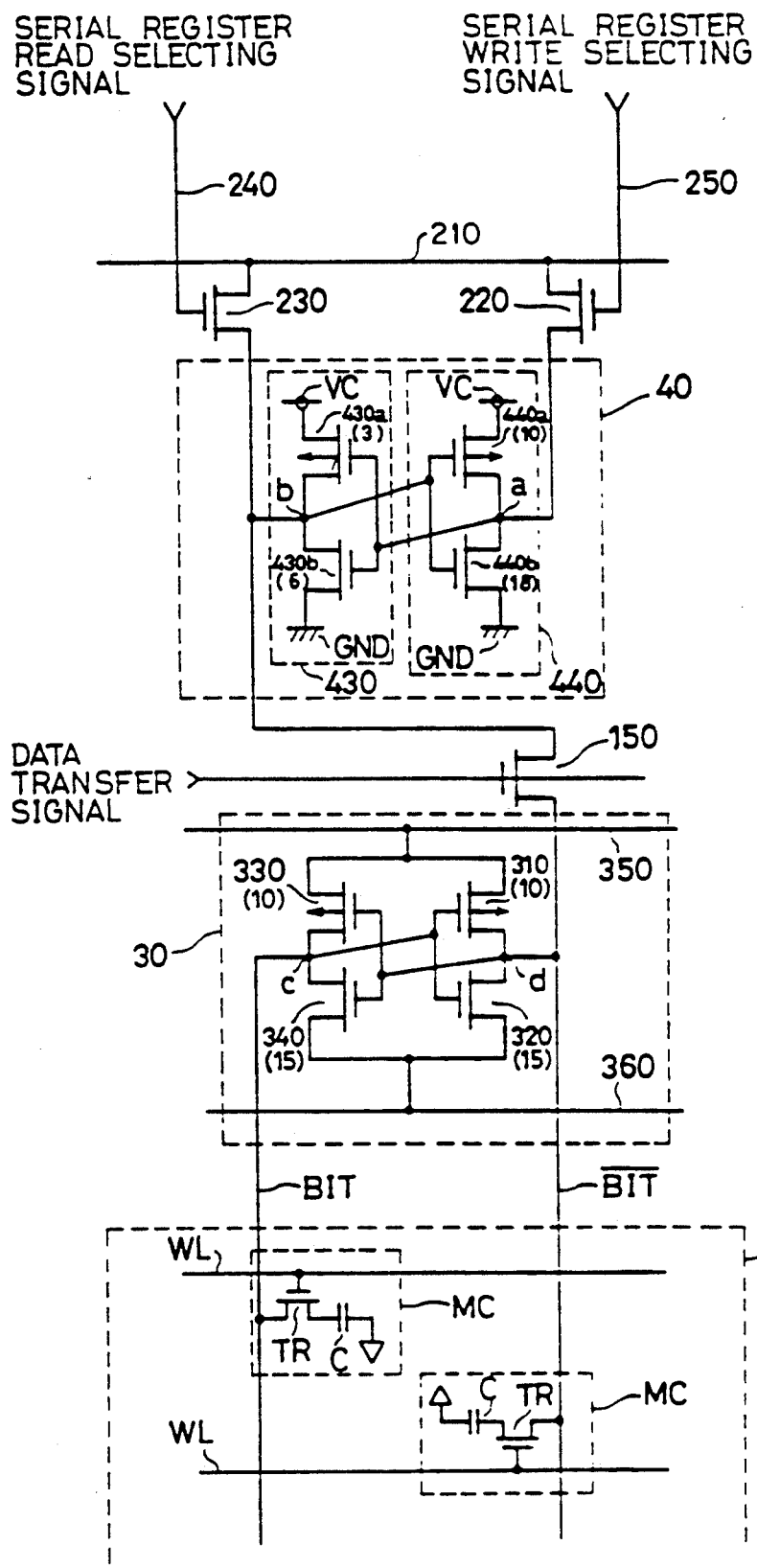
FIG. 3 is a circuit diagram showing in detail the structure of a structure for serial data reading and writing provided corresponding to an arbitrary bit line pair of FIG. 1.

FIG. 3 is a circuit diagram of a structure of a circuit portion for serial data reading and writing, which is provided corresponding to an arbitrary bit line pair of FIG. 1. Sense amplifier 30 and serial memory cell 40 are both shown in more detail than in FIG. 1, in FIG. 3.

Referring to FIG. 3, the transfer of data from sense amplifier 30 to the corresponding serial memory cell 40 is carried out by bringing the data transfer signal provided to the gate of transistor 150 at an H level for a constant time period at a timing similar to that of a conventional case. This causes transistor 150 to conduct for the above mentioned constant time period. On transistor 150 conducting, nodes b and d are electrically connected. Therefore, in the case transistor 150 conducts when the potentials of nodes c and d are at the H and L level, respectively, and the potentials of nodes a and b are at the L and H level, respectively, node b has current drawn to signal line 360 which is at the ground potential via transistors 150 and 320, and current provided from power supply VC via transistor 430a. More specifically, the current flowing from power supply VC to node b via transistor 430a prevents the potential of node b from attaining the L level. However, in the present embodiment, the size of transistor 430a is smaller than that of transistor 440a, and also sufficiently smaller than that of transistor 320. As a result, the current flowing from voltage supply VC to node b via transistor 430a is sufficiently smaller than that flowing from node b to signal line 360 via transistors 150 and 320. Therefore, the potential of node b quickly attains an L level in response to the conduction of transistor 150. Accordingly, the potential of node a quickly attains an H level.

In the case transistor 150 conducts when the potentials of nodes c and d are at L and H levels, respectively, and the potentials of nodes a and b are at H and L levels, respectively, the current flowing from node b to ground GND via transistor 430b prevents the potential of node b from attaining an H level. However, in the present embodiment, the size of transistor 430b is smaller than that of transistor 440b, and also sufficiently smaller than that of transistor 310. The current flowing from node b to ground GND via transistor 430b is sufficiently smaller than that flowing from signal line 350 which is at the power potential to node b via transistors 310 and 150. Accordingly, the potential of node b quickly attains an H level in response to the conduction of transistor 150. Therefore, the potential of node a quickly attains an L level.

It can be understood from the above description that in the present embodiment, the data readout from memory array 2 to sense amplifier 30 is efficiently transferred to serial memory cell 40 regardless of the data stored previously in serial memory cell 30.

Figure 4:
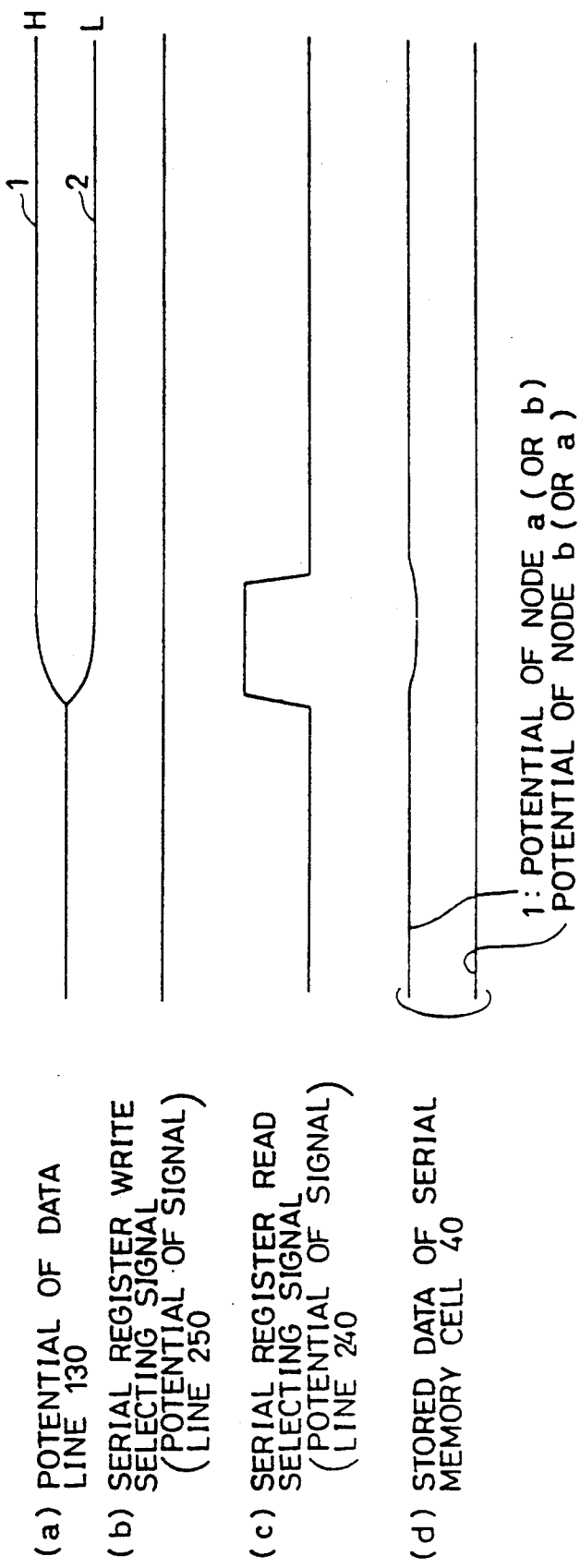
FIGS. 4(a)-(d) are a timing chart for explaining the circuit operation for transferring data from a arbitrary serial memory array to data lines of FIG. 1.

Referring to FIG. 1, the data transferred from sense amplifier portion 3 to all the serial memory cells 40 in serial memory array 4 are respectively transferred to data line 210 via a single transistor 220. Data transfer from serial memory cell 40 to data line 210 is carried out by all the transistors 220 becoming conductive one by one sequentially over time. More specifically, shift register 6 applies a potential of H level for a constant time period to all signal lines 240 one by one sequentially over time. FIG. 4 is a timing chart indicating the potential change in signal lines and nodes at the time of data transfer from serial memory cell 40 to data line 210.

The circuit operation for data transfer from serial memory cell 40 to data line 210 will be explained more specifically with reference to FIGS. 3 and 4. In the following description, the signal applied to signal line 240 from serial register 6 is called the serial register read selecting signal.

Data line 210 is fixed to an intermediate potential between the power potential and the ground potential until the switching element (transistor 220 in the present embodiment) provided between serial memory cell 40 and data line 130 conducts, similarly to a conventional one. This fixation is released when the switching element becomes conductive. Therefore, until the serial register read selecting signal applied to signal line 240 in FIG. 3 is brought to an H level for a constant time period, as shown in FIG. 4(c), the potential of data line 210 is at an intermediate potential between the L and H level, as shown in FIG. 4(a). When serial register read selecting signal rises, data line 210 and node a are electrically connected. At this time, node a is applied with the output of inverter 440 which receives the potential of node b latching the data transferred from sense amplifier 30. Thus, inverter 440 functions to transfer data from serial memory cell 40 to data line 210.

More specifically, when the potential of node a is at an H level, the conduction of transistor 220 causes the potential of data line 210 to rise to an H level by the current flowing from power supply VC to data line 210 via transistors 440a and 220, as shown in curve 1 of FIG. 4(a). When the potential of node a is at an L level, the potential of data line 210 drops to an L level by the current flowing from data line 210 to ground GND via transistors 220 and 440b, in response to the conduction of transistor 220, as shown in curve 2 of FIG. 4(a).

Because the size of transistor 440a is large in the present embodiment, the current flowing from power supply VC to data line 210 via transistors 440a and 220 is large when the potential of node a is at an H level. Also, because the size of transistor 440b is large, the current flowing from data line 210 to ground GND via transistor 220 and 440b is large when the potential of node a is at the L level. Therefore, the potential of data line 210 easily changes according to the data stored temporarily in serial memory cell 40 (FIG. 4(d)). Therefore, data is transferred easily from serial memory cell 40 to data line 210.

When the serial register read selecting signal drops, the potential of data line 210 will not change since transistor 220 returns to the non-conductive state. In the present embodiment, a sense amplifier not shown senses and amplifiers the change of potential in data line 210 from the intermediate potential right after the drop of the serial register read selecting signal, i.e. right after transistor 220 returns to the non-conductive state. The signal sensed and amplified by the sense amplifier not shown is provided to an external source from serial data output terminal SDO of FIG. 6 as the readout data.

Thus, at the time of serial data reading, data readout from memory array 2 is easily transferred from sense amplifier 30 to serial memory cell 40, and from the serial memory cell 40 to data line 210. Therefore, the time to read out serial data is reduced in comparison with a conventional one.

The data temporarily stored in all the serial memory cells 40 in serial memory array 4 are read out to data line 210 one by one sequentially, since the potential of signal line 240 of FIG. 1 actually attains an H level sequentially over time, as described above. Transistor 230 is always at the non-conductive state since the potential of all signal lines 250 are always at the L level at the time of serial data reading (FIG. 4(b)).

Figure 5:
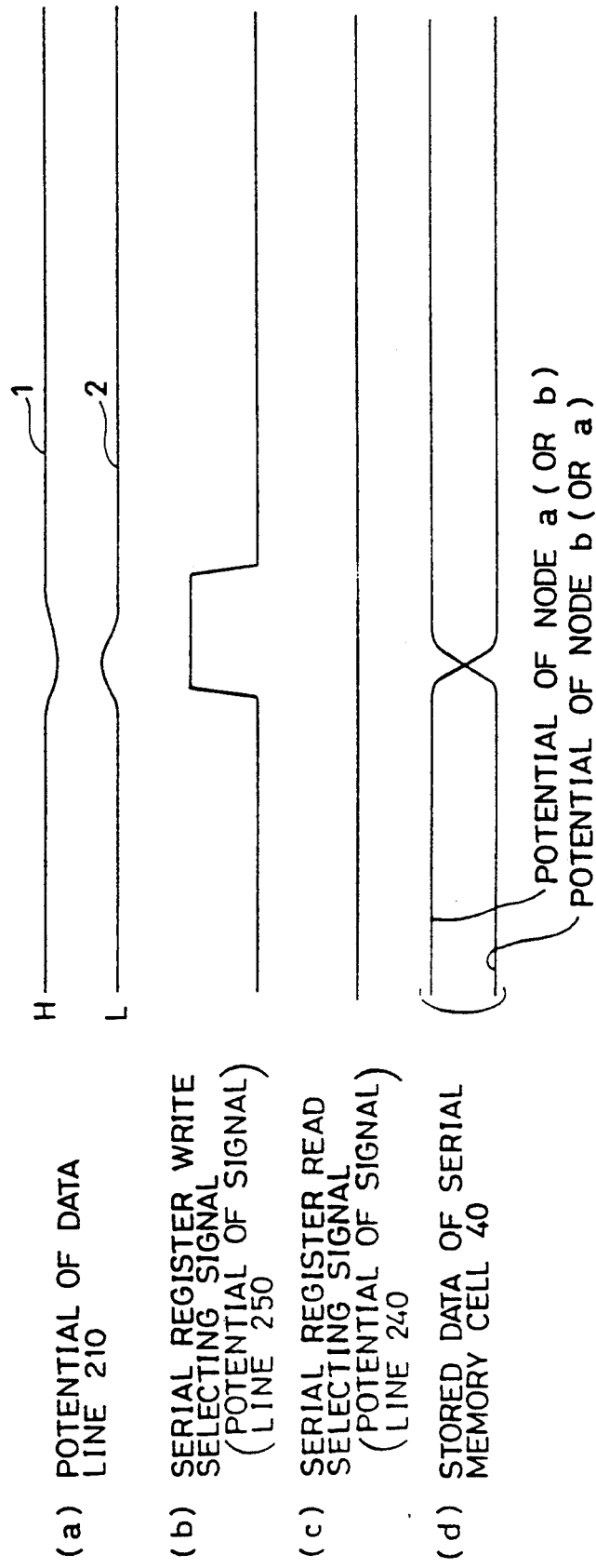
FIGS. 5(a)-(d) are a timing chart for explaining the circuit operation for transferring data from data lines to an arbitrary serial memory cell.

The circuit operation for serial data writing in the dual port memory of the present embodiment will be explained hereinafter with reference to FIGS. 1, 3 and 5. FIG. 5 is a timing chart showing the potential change of signal lines and nodes at the time of transferring data from data line 210 to serial memory cell 40. In the following description, the signal applied from serial register 6 to signal line 250 is called a serial register write selecting signal.

At the time of serial data writing, a potential according to the logic value for each write data (a potential of H or L level) is applied to data line 210 from serial data input terminal SDI of FIG. 6. The transfer of the write data applied from data line 210 to serial memory array 4 is carried out by transistor 230 becoming conductive. More specifically, shift register 6 applies an H level potential for a constant time period to all the signal lines 250 one by one in sequence over time. As a result, each write data is temporarily stored in the serial memory cell provided corresponding to bit line. BIT or $\overline{\text{BIT}}$ to which the memory cell MC to be written is connected, out of serial memory cells 40 in serial memory array 4. The circuit operation for transferring data from data line 210 to serial memory array 4 will be explained more specifically.

The case is considered where the potential of data line 210 is at the H level, and the potential of node b is at the L level, for example in FIG. 3. When transistor 230 conducts in this state, the current flowing from node b to ground GND via transistor 430b prevents the potential of node b from attaining the H level according to the current flowing from data line 210 to node b via transistor 230. However, the size of transistor 430b is small in the present embodiment. Therefore, the current flowing from node b to ground GND via transistor 430b is small enough so as not to prevent the change of potential of node b to the H level. Accordingly, the potential of node b immediately attains an H level in response to the conduction of transistor 230. In response, the potential of node a attains an L level.

In the case transistor 230 conducts when the potential of data line 210 is at the L level, and the potential of node b is at the H level, the current flowing from power supply VC to node b via transistor 430a prevents the potential of node b to attain the L level in response to the current flowing from node b to data line 210 via transistor 230. However, because the size of transistor 430a is small in the present embodiment, the current flowing from power supply VC to node b via transistor 430a is small enough so as not to prevent the change of the potential of node b to an L level. Therefore, the potential of node b quickly attains an L level in response to the conduction of transistor 230. In response, the potential of node a attains an H level.

In the present embodiment the potentials of nodes a and b quickly change according to the level of data line 210, regardless of the data previously stored in serial memory cell 40. In other words, the data stored in serial memory cell 40 switches to a data according to the potential applied to data line 210 (curves 1 or 2 in FIG. 5(a)), quickly in response to the rise of the serial register write selecting signal (FIG. 5(b)), as shown in FIG. 5(d).

In FIG. 1, each of the write data transferred from data line 210 to serial memory cell 40 is transferred to sense amplifier 30 via a single transistor 150. The circuit operation for transferring data from serial memory cell 40 to the corresponding sense amplifier 30 will be explained more specifically hereinafter.

In FIG. 3, the transfer of data from serial memory cell 40 to sense amplifier 30 is carried out by making transistor 150 conductive for a constant time period by the data transfer signal attaining an H level for a constant time period. Therefore, inverter 430 of the smaller size out of the two inverters 430 and 440 forming serial memory cell 40 functions to transfer data from serial memory cell 40 to sense amplifier 30. At the time of serial data writing, transistor 220 is always at the non-conductive state, since the serial register read selecting signal (FIG. 5(c)) is always at the L level.

Similar to a conventional case, sense amplifier 30 is activated after transistor 150 conducts. More specifically, the potentials (FIGS. 11(c) and 11(d)) of signal lines 350 and 360 attain the power potential and the ground potential, respectively, after the rise of the data transfer signal (FIG. 11(f)). Therefore, if the potential of node b is at the H level just before transistor 150 conducts, current flows to node d from power supply VC via transistors 430a and 150 during the time period from the conduction of transistor 150 till the activation of sense amplifier 30. Accordingly, the potential of node d rises from the potential of the equalized bit signal $\overline{BIT}$. However, because the size of transistor 430a is small in the present embodiment, the current flowing from power supply VC to node d via transistors 430a and 150 is small. As a result, the rise in potential in node d during the above mentioned time period is small.

If the potential of node d is at the L level just before the conduction of transistor 150, current flows from node d to ground GND via transistors 150 and 430b during the time period from the conduction of transistor 150 till the activation of sense amplifier 30. Therefore, the potential of node d drops from the potential of the equalized bit signal $\overline{BIT}$. However, because the size of transistor 430b is small in the present embodiment, the current flowing from node d to ground GND via transistors 150 and 430b is small. Therefore, the drop in potential of node d during the above mentioned time period is small.

During the time period till sense amplifier 30 is activated, the amount of potential change according to the write data temporarily stored in serial memory cell 40 is small in node d. The threshold voltage and size of transistors 310, 320, 330 and 340 forming sense amplifier 30 are set so that the small potential change generated in bit lines BIT or $\overline{BIT}$ by the data stored in memory cell MC can be amplified by sense amplifier 30. This potential change generated in bit line BIT or $\overline{BIT}$ is smaller than the potential change generated in node d during the time period from the conduction of transistor 150 till the activation of sense amplifier 30. By the activation of sense amplifier 30, the potential change generated in node d is amplified sufficiently by sense amplifier 30. In other words, the write data stored temporarily in serial memory array 40 is easily transferred to sense amplifier 30 regardless of the small size of inverter 430. When the write data has been transferred to all the sense amplifiers 30 in sense amplifier portion 3 in FIG. 1, an H level potential is applied to the selected word line WL, similar to the conventional case. This causes the write data transferred to sense amplifiers 30 to be written into memory cells MC of one row connected to the selected word line WL.

Hence, the dual port memory of the present embodiment carries out data transfer from data line 210 to serial memory cell 40 easily for serial data writing, without hindering data from being transferred to sense amplifier 30 from serial memory cell 40. Therefore, the time for serial data writing is reduced in comparison with a conventional dual port memory.

The transient phenomenon such as slight potential change generated in nodes a and b of serial memory cell 40 at the time of transferring data from serial memory cell 40 to data line 210, and slight potential change generated in data line 30 at the time of transferring data from data line 210 to serial memory cell 40 is similar to that generated in nodes a and b at the time of transferring data from serial memory cell 40 to data lines 100 and 110 in the dual port memory shown in FIG. 7, and generated in data lines 100 and 110 at the time of transferring data from data lines 100 and 110 to serial memory cell 40 in the dual port memory shown in FIG. 7.

That is to say, at the time of transferring data from serial memory cell 40 to data line 210, current flows to data line 210 from node a or b which latches the H level potential. Therefore, the potential of node a or b latching the H level potential is slightly lower than the H level, as shown in curve 1 of FIG. 4(d), during the time period the serial register read selecting signal is at the H level. At the time of data transfer from data line 210 to serial memory cell 40, current flows from data line 210 to node a or b latching a potential of the L level, when the potential of data line 210 attains at an H level; and current flows from the node a or b latching an H level potential to data line 210, when the potential of data line 210 attains an L level. As shown in FIG. 5(a), therefore, the potential of data line 210 slightly rises (when the potential of data line 210 is at the L level: curve 2) or slightly drops (when the potential of data line 210 is at the H level: curve 1), in response to the rise of serial register write selecting signal.

Thus, with reference to FIG. 1, at the time of serial data reading in the dual port memory of the present embodiment, the readout data applied to node b from sense amplifier 30 is temporarily stored by inverters 430 and 440 and then transferred from node a to data line 210 in FIG. 1. At the time of serial data writing, the write data applied from data line 210 to node b is temporarily stored by inverters 430 and 440 and then provided from node b to sense amplifier 30. Therefore, data output from serial memory cell 40 to data line 210 and the data output from serial memory cell 40 to sense amplifier 30 are carried out by different inverters 430 and 440, respectively.

At the time of serial data reading, the output of sense amplifier 30 will collide with the output of inverter 430. At the time of serial data writing, the output of data line 210 will collide with the output of inverter 430. Therefore, by decreasing the drive capability of inverter 430, data transfer from data line 210 to serial memory cell 40 and from sense amplifier 30 to serial memory cell 40 can both be carried out easily. Meanwhile, the drive capability of inverter 440 may be set taking into consideration only data transfer from serial memory cell 40 to data line 210. In other words, if the drive capability of inverter 440 is increased, data can be transferred easily from serial memory cell 40 to data line 210. Thus, as in the present embodiment, the serial data reading and writing speed can both be improved by setting the drive capability of inverters 430 and that of inverter 440 complementarily.

In practice, the size of transistors 430a and 430b forming inverter 430 and the size of transistors 440a and 440b forming inverter 440 should be determined considering the size of transistors 310, 320, 330 and 340 forming sense amplifier 30. The value in the parenthesis in FIG. 3 indicates an example of the ratio of the size (channel width W) of each of the eight transistors 310, 320, 330, 340, 430a, 430b, 440a, 440b to the size (channel width W) of the other seven transistors. The ratio of the size of these eight transistors are not limited to those shown in FIG. 3.

The adjustment of the size (drive capability) of each transistor forming inverters 430 and 440 can be achieved by not only changing the channel width W but also changing other factors, for example the channel length, i.e. gate width L, and the gate thickness T.

According to the present embodiment, the two required data lines in conventional dual port memories is reduced to one data line so that the area occupied by serial bus line 5 per dual port memory chip 1 in FIG. 6 is reduced. This will contribute to increase the storage capacity of a dual port memory.

Figure 17:
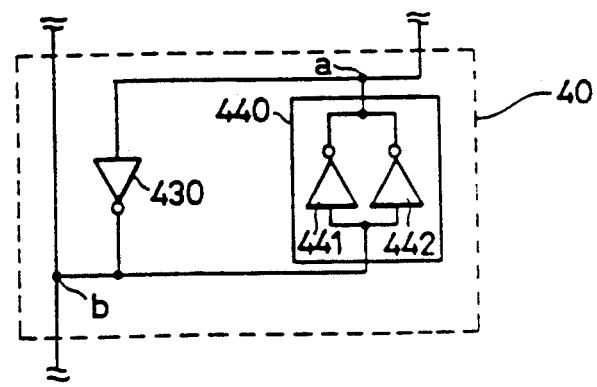
FIG. 17 is a circuit diagram of a structure of a serial memory cell in a dual port memory according to another embodiment of the present invention.

In each serial memory cell 40 of the above embodiment, the drive capability of the P channel MOS transistor and the N channel MOS transistor forming inverter 440 are set to be greater than that of the P channel MOS transistor and the N channel MOS transistor forming inverter 430, so that the drive capability of inverter 440 for transferring the output data of sense amplifier 30 to I/O line 210 is greater than that of inverter 430 for transferring the signal on I/O line 210 to sense amplifier 30. However, the method of setting the drive capability of inverter 440 to be greater than that of inverter 430 is not limited to the above described method. FIG. 17 is a diagram showing another method of setting the drive capability of inverter 440 to be greater than that of inverter 430.

FIG. 17 shows a structure of a serial memory cell 40. All the other serial memory cells 40 have a structure identical to that shown in FIG. 17.

Referring to FIG. 17, a serial memory cell 40 comprises inverter 440 formed of a parallel connection circuit of a plurality of inverters 441 and 442.

FIG. 18 is a circuit diagram showing in detail inverter 440 of FIG. 17. Referring to FIG. 18, inverter 440 comprises an inverter 441 implemented with a P channel MOS transistor 441a and an N channel MOS transistor 441b connected in series between power supply VC and ground GND, and an inverter 442 implemented with a P channel MOS transistor 442a and an N channel MOS transistor 442b connected in parallel with transistors 441a and 441b, respectively. The gates of transistors 441a and 441b, and transistors 442a and 442b are connected to node b. The nodes of transistors 441a and 441b, and of transistors 442a and 442b are commonly connected to node a.

When a potential of a high level is transferred to node b from sense amplifier 30 via transistor 150 at the time of serial data reading, the two N channel MOS transistors 441b and 442b are turned on. When a potential of a low level is transferred to node b from sense amplifier 30 via transistor 150, the two P channel MOS transistors 441a and 442a in inverter 440 are turned on. Therefore, the current drawn by inverter 440 from data line 130 via node a and transistor 220 to bring the potential of data line 210 to a low level, and the current which inverter 440 provides to data line 210 via node a and transistor 220 to bring the potential of data line 210 to a high level are both driven by the two MOS transistors. If the drive capability of P channel MOS transistor 430a and N channel MOS transistor 430b forming inverter 430 are identical to those of P channel MOS transistors 441a and 442a and N channel MOS transistors 441b and 442b forming inverter 440 are similar, the drive capability of inverter 440 becomes two times that of inverter 430.

Although each of the above mentioned embodiments was described in which the present invention is applied to a dual port memory, the present invention is applicable to any semiconductor memory device in which data is transferred between at least two types of memory arrays and between these memory arrays and a data line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a first memory array having a plurality of first memory cells arranged in a plurality of columns,
a second memory array for temporarily storing a read out data signal from said first memory array and write data signal to be written into said first memory array, said second memory array including a plurality of second memory cells provided corresponding to said plurality of columns,
wherein each of said second memory cells includes first and second complementary storage nodes,
bidirectional inverting means interconnecting said first and second storage nodes;
means for limiting magnitude of current flow within said inverting means in one direction to be less than that within said inverting means in the opposite direction,
data bus means for receiving a data signal read out from said second memory cell and an externally applied data signal,
read out means for reading out a data signal from one of said plurality of first memory cells,
amplifying means for reading and amplifying both a data signal read out by said read out means and a data signal temporarily stored in each second memory cell,
first connecting means for electrically connecting one node of said complementary storage nodes to said amplifying means at the time of data reading and data writing,
second connecting means, for electrically connecting the other one of said complementary storage nodes to said data bus means, after said one node is electrically connected to said amplifying means by said first connecting means, at the time of said data reading, and
third connecting means for electrically connecting said one node to said data bus means, before said one node is electrically connected to said amplifying means by said first connecting means, at the time of said data writing.

2. A semiconductor memory device comprising:
a first memory array having a plurality of first memory cells arranged in a plurality of columns,
a second memory array for temporarily storing a readout data signal from said first memory array and a write data signal to be written into said first memory array, said second memory array including a plurality of second memory cells provided corresponding to said plurality of columns,
wherein each second memory cell includes
a first node,
a second node,
first inverting means for inverting the potential of said first node to provide the same to said second node,
second inverting means for inverting the potential of said second node to provide the same to said first node, the drive capability of said first inverting means being greater than that of said second inverting means,
data bus means for receiving both a data signal readout from said second memory cell and an externally applied data signal,
readout means for reading out a data signal from one of said plurality of first memory cells,
amplifying means for sensing and amplifying both a data signal readout by said readout means and a data signal temporarily stored in said each second memory cell,
first connecting means for electrically connecting each first node to said amplifying means at the time of data reading and data writing, second connecting means for electrically connecting and disconnecting said each second node to and from said data bus means during data reading and data writing, respectively, third connecting means for electrically connecting and disconnecting said each first node to and from said data bus means during data writing and data reading respectively, and first and second control signal generating means generating control signals for controlling said second and third connecting means, said first control signal generating means generating a first control signal for controlling the second connecting means to connect the second node to said data bus means during data reading and to isolate the second node from said data bus during data writing, said second control signal generating means generating a second control signal for controlling the third connecting means to connect the first node to said data bus means during data writing and to isolate the first node from said data bus means during data reading.

3. The semiconductor device according to claim 2, wherein
said first inverting means comprises first and second field effect semiconductor elements having complementary polarities connected in series between a high potential power supply and a low potential power supply, said second inverting means comprises third and fourth field effect semiconductor elements connected in series between said high potential power supply and said low potential power supply, and having a polarity identical to that of said first field effect semiconductor element and a polarity identical to that of said second field effect semiconductor element, respectively, the drive capability of said first field effect semiconductor element is greater than that of said third field effect semiconductor element, the size of said second field effect semiconductor element is larger than that of said fourth field effect semiconductor element.

4. The semiconductor memory device according to claim 2, wherein
said first inverting means comprises a plurality of inverters connected between said first node and said second node in parallel to each other, and said second inverting means comprises a single inverter connected between said first node and said second node in anti-parallel to said plurality of inverters.

5. The semiconductor memory device according to claim 2, wherein
said first memory array further comprises first and second bit lines provided corresponding to each of said plurality of columns, said data signal stored in each first memory cell is read out by said readout means to said first and second bit lines corresponding to said columns in which it is arranged, said amplifying means comprises a plurality of differential amplifying means provided corresponding to said plurality of columns.

6. The semiconductor memory device according to claim 5, wherein
each of said plurality of differential amplifying means comprises
first and second signal lines, fifth and sixth field effect semiconductor elements of complementary polarity, provided between said first signal line and the corresponding said first bit line, and between said second signal line and the corresponding said first bit line, respectively, and controlled according to the potential of the corresponding said second bit line, seventh and eight field effect semiconductor elements of complementary polarity, provided between the corresponding said second bit line and said first signal line and between the corresponding said second bit line and said second signal line, respectively, and controlled according to the potential of the corresponding said first bit line, the polarity of said seventh field effect semiconductor element is identical to that of said fifth field effect semiconductor element, the polarity of said eight field effect semiconductor element is identical to that of said sixth field effect semiconductor element, said first and second signal lines are applied with a high potential and a low potential, respectively, after said first node and said amplifying means are electrically connected by said first connecting means, at the time of said data writing, said first and second signal lines are applied with said high potential and said low potential, respectively, before said first node is electrically connected to said amplifying means, at the time of said data reading.

7. The semiconductor memory device according to claim 6, wherein
said first connecting means comprises a plurality of ninth field effect semiconductor elements provided corresponding to said plurality of columns, each of said plurality of ninth field effect semiconductor elements are connected between the corresponding said differential amplifying means and said first node of the corresponding said second memory cell, and controlled to conduct only at the time of said data writing and said data reading.

8. The semiconductor memory device according to claim 7, wherein
said second connecting means comprises a plurality of tenth field effect semiconductor elements provided corresponding to said plurality of columns, each of said plurality of tenth field effect semiconductor elements is provided between said second node of the corresponding said second memory cell and said data bus means, and controlled to conduct after the corresponding said ninth field effect semiconductor elements is conductive, at the time of said data reading.

9. The semiconductor memory device according to claim 8, wherein
said third connecting means comprises a plurality of eleventh field effect semiconductor elements provided corresponding to said plurality of columns, each of said plurality of eleventh field effect semiconductor elements is provided between said first node of the corresponding said second memory cell and said data bus means, and controlled to conduct before the corresponding said ninth field effect semiconductor element is conductive, at the time of said data writing.

10. The semiconductor memory device according to claim 7, wherein
said third connecting means comprises a plurality of eleventh field effect semiconductor elements provided corresponding to said plurality of columns, each of said plurality of eleventh field effect semiconductor elements is provided between said first node of the corresponding said second memory cell and said data bus means, and controlled to conduct before the corresponding said ninth field effect semiconductor element is conductive, at the time of said data writing.

11. The semiconductor memory device according to claim 7, wherein said plurality of ninth field effect semiconductor elements conduct simultaneously.

12. The semiconductor memory device according to claim 8, wherein each of said plurality of tenth field effect semiconductor elements conducts sequentially over time.

13. The semiconductor memory device according to claim 9, wherein each of said plurality of eleventh field effect semiconductor elements conducts sequentially over time.

14. The semiconductor memory device according to claim 10, wherein each of said plurality of eleventh field effect semiconductor elements conducts sequentially over time.

15. The semiconductor memory device according to claim 1, wherein said data bus means comprises a single signal line.

16. The semiconductor memory device according to claim 2, wherein said data bus means comprises a single signal line.

17. The semiconductor memory device according to claim 9, wherein said data bus means comprises a single signal line.

18. The semiconductor memory device according to claim 1, wherein
said plurality of first memory cells are arranged also in a plurality of rows in said first memory array,
said first memory array further comprises a plurality of word lines provided corresponding to said plurality of rows,
each of said first memory cells comprises a twelfth field effect semiconductor element and a capacitance coupling element, connected in series between one of said first and said second bit lines corresponding to said column in which it is arranged and the low potential power supply,
each of said twelfth field effect semiconductor element of said first memory cells arranged along the same said row is controlled by the potential of said word line corresponding to said same row.

19. The semiconductor memory device according to claim 2, wherein
said plurality of first memory cells are arranged also in a plurality of rows in said first memory array,
said first memory array further comprises a plurality of word lines provided corresponding to said plurality of rows,
each of said first memory cells comprises a twelfth field effect semiconductor element and a capacitance coupling element, connected in series between one of said first and said second bit lines corresponding to said column in which it is arranged and the low potential power supply,
each of said twelfth field effect semiconductor element of said first memory cells arranged along the same said row is controlled by the potential of said word line corresponding to said same row.

20. The semiconductor memory device according to claim 17, wherein
said plurality of first memory cells are arranged also in a plurality of rows in said first memory array,
said first memory array further comprises a plurality of word lines provided corresponding to said plurality of rows,
each of said first memory cells comprises a twelfth field effect semiconductor element and a capacitance coupling element, connected in series between one of said first and said second bit lines corresponding to said column in which it is arranged and the low potential power supply,
each of said twelfth field effect semiconductor element of said first memory cells arranged along the same said row is controlled by the potential of said word line corresponding to said same row.

21. A method of operating a semiconductor memory device comprising:
a first memory array having a plurality of first memory cells arranged in a plurality of columns,
a second memory array for temporarily storing a read out data signal from said first memory array and a write data signal to be written into said first memory array, said second memory array including a plurality of second memory cells provided corresponding to said plurality of columns,
wherein each second memory cell includes first and second mutually complementary storage nodes,
data bus means for receiving a data signal read out from said second memory cell and an externally applied data signal,
read out means for reading out a data signal from one of said plurality of first memory cells,
amplifying means for sensing and amplifying both a data signal read out by said read out means and a data signal temporarily stored in each of said second memory cell,
the method comprising the steps of:
electrically connecting each first node to said amplifying means during data reading and data writing,
electrically connecting each second node to said data bus means during data reading and electrically isolating said each second node from said data bus means during data writing, and
electrically connecting said each first node to said data bus means during data writing and electrically isolating said each first node from data bus means during data reading.

22. A semiconductor memory device comprising:
a first memory array having a plurality of first memory cells arranged in a plurality of columns;
a second memory array for temporarily storing a read out data signal from said first memory array and a write data signal to be written into said first memory array, said second memory array including a plurality of second memory cells provided corresponding to said plurality of columns,
wherein each of said second memory cells includes first and second complementary storage nodes,
bidirectional inverting means interconnecting said first and second storage nodes,
means for limiting magnitude of current flow within said inverting means in one direction to be less than that within said inverting means in the opposite direction, data bus means for receiving a data signal read out from said second memory cell and an externally applied data signal, read out means for reading out a data signal from one of said plurality of first memory cells, sense amplifier means for sensing and amplifying a data signal read out by said read out means and a data signal temporarily stored in each second memory cell, first connecting means for electrically connecting one node of said complementary storage nodes to said sense amplifier means at the time of data reading and data writing, second connecting means, for electrically connecting and disconnecting the other one of said complementary storage nodes to and from said data bus means during data reading and data writing, respectively, third connecting means for electrically connecting and disconnecting said one node to and from said data bus means during data writing and data reading, respectively, first and second control signal generating means for generating control signals for controlling said second and third connecting means, said first control signal generating means generating a first control signal for controlling the second connecting means to connect said other node to said data bus means during data reading and to isolate said other node from said data bus during data writing, said second control signal generating means generating a second control signal for controlling the third connecting means to connect said one node to said data bus means during data writing and to isolate said one node from said data bus means during data reading.

* * * * *